US012751141B2

(12) United States Patent
Lee et al.

(10) Patent No.: US 12,751,141 B2
(45) Date of Patent: Sep. 29, 2026

(54) DISPLAY DEVICE

(71) Applicant: Samsung Display Co., LTD., Yongin-si (KR)

(72) Inventors: Cheol Gon Lee, Yongin-si (KR); Hee Rim Song, Yongin-si (KR); Mu Kyung Jeon, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 19/012,684

(22) Filed: Jan. 7, 2025

(65) Prior Publication Data

US 2025/0294965 A1 Sep. 18, 2025

(30) Foreign Application Priority Data

Mar. 15, 2024 (KR) ........................ 10-2024-0036349

(51) Int. Cl.
*H10K 59/121* (2023.01)
*G06V 40/13* (2022.01)
(Continued)

(52) U.S. Cl.
CPC ..... *H10K 59/1213* (2023.02); *G06V 40/1318* (2022.01); *G09G 3/3233* (2013.01);
(Continued)

(58) Field of Classification Search
CPC ...... G06F 3/041–047; G06F 2203/041–04114; G06F 3/0412; G06F 3/042; G06V 40/13; G06V 40/12; G06V 40/1318; H10K 59/353; H10K 59/40; H10K 59/60; H10K 59/65; G09G 2300/0426; G09G 3/3233
See application file for complete search history.

(56) References Cited

U.S. PATENT DOCUMENTS

2009/0056876 A1 3/2009 Kim et al.
2016/0132176 A1* 5/2016 Bae ........................ G06F 3/0412
345/174

(Continued)

FOREIGN PATENT DOCUMENTS

KR 10-2018-0067196 A 6/2018
KR 10-2019-0015688 A 2/2019
KR 10-2020-0034336 A 3/2020

*Primary Examiner* — Sanjiv D. Patel
(74) *Attorney, Agent, or Firm* — Womble Bond Dickinson (US) LLP

(57) ABSTRACT

A display device includes first-first, first-second, and first-third pixel circuits, and a first sensor circuit in a first row, second-first, second-second, and second-third pixel circuits, and a second sensor circuit in a second row, third-first, third-second, and third-third pixel circuits, and a third sensor circuit in a third row, a first-first pixel electrode in a first pixel row corresponding to the first row, and connected to the first-first pixel circuit, a first sensor electrode in the first pixel row, and connected to the first sensor circuit, a second sensor electrode in the first pixel row, and connected to the second sensor circuit, a second-first pixel electrode in a second pixel row corresponding to the second row, and connected to the second-first pixel circuit, and a third sensor electrode in a third pixel row corresponding to the third row, and connected to the third sensor circuit.

20 Claims, 26 Drawing Sheets

(51) Int. Cl.
*G09G 3/3233* (2016.01)
*H10K 39/34* (2023.01)

(52) U.S. Cl.
CPC ..... *H10K 39/34* (2023.02); *G09G 2300/0426* (2013.01); *G09G 2300/0819* (2013.01); *G09G 2300/0842* (2013.01); *G09G 2300/0861* (2013.01)

(56) References Cited

U.S. PATENT DOCUMENTS

| | | | | |
|---|---|---|---|---|
| 2021/0042493 | A1* | 2/2021 | Lius ..................... | G09G 3/2003 |
| 2022/0093704 | A1* | 3/2022 | Yuan .................... | H10K 59/131 |
| 2022/0109042 | A1* | 4/2022 | Kim ..................... | H10K 59/131 |
| 2022/0285460 | A1* | 9/2022 | Kim ..................... | H10K 59/873 |
| 2023/0343290 | A1 | 10/2023 | Lee et al. | |

* cited by examiner

MTL : BML1
ACTL1 : SE2, ACT2, DE2, SE1, ACT1, DE1
GTL1 : GE2, GE1, GWL, CPE1
GTL2 : BML2, CPE2
ACTL2 : DE3, ACT3, SE3
GTL3 : GE3, GCL
SDL1 : CE1, CE2, CE3, VDLa
SDL2 : DL, VDLb

MTL : BML1
ACTL1 : PSE1, PACT1, PDE1, PSE3-1, PACT3-1, PDE3-1, PSE3-2, PACT3-2, PDE3-2
GTL1 : PGE1, PGE3-1, PGE3-2, EML, GBL
GTL2 : BML2
ACTL2 : PDE2, PACT2, PSE2
GTL3 : PGE2, GCL
SDL1 : ROE, VIL2b, NSE1, VDLa, VBL, VIL1a
SDL2 : ROL, VIL1b, NSE2
SDL3 : VIL1c, NSE3

DISPLAY DEVICE

CROSS-REFERENCE TO RELATED APPLICATION

The present application claims priority to, and the benefit of, Korean Patent Application No. 10-2024-0036349, filed on Mar. 15, 2024, in the Korean Intellectual Property Office, the entire disclosure of which is incorporated herein by reference.

BACKGROUND

1. Field

The present disclosure relates to a display device.

2. Description of the Related Art

With the advance of information-oriented society, more and more demands are placed on display devices for displaying images in various ways. For example, display devices are employed in various electronic devices, such as smartphones, digital cameras, laptop computers, navigation devices, and smart televisions. In the display device, because each of pixels of a display panel includes a light-emitting element capable of emitting light by itself, an image can be displayed without a backlight unit providing light to the display panel.

The display device may include a display panel that displays an image, an optical sensor that detects light, a fingerprint sensor that detects a person's fingerprint, and an illumination sensor that detects surrounding brightness. With diversification of electronic devices employing display devices, it is suitable for the display devices to be provided in various designs. For example, the display device may widen a display area for displaying an image by removing a sensor device, such as a light sensor, a fingerprint sensor, or an illumination sensor that are separately arranged in a non-display area.

SUMMARY

Aspects of the present disclosure provide a display device capable of improving resolution of pixels while maintaining sensitivity of a fingerprint sensor without adding a mask process, and capable of improving fingerprint sensitivity by reducing or minimizing sensing errors according to a finger's contact angle.

However, aspects of the present disclosure are not restricted to the one set forth herein. The above and other aspects of the present disclosure will become more apparent to one of ordinary skill in the art to which the present disclosure pertains by referencing the detailed description of the present disclosure given below.

According to one or more embodiments, a display device includes a first-first pixel circuit, a first-second pixel circuit, a first-third pixel circuit, and a first sensor circuit arranged sequentially in a first circuit row, a second-first pixel circuit, a second-second pixel circuit, a second-third pixel circuit, and a second sensor circuit arranged sequentially in a second circuit row following the first circuit row, a third-first pixel circuit, a third-second pixel circuit, a third-third pixel circuit, and a third sensor circuit arranged sequentially in a third circuit row following the second circuit row, a first-first pixel electrode in a first pixel row corresponding to the first circuit row, and electrically connected to the first-first pixel circuit, a first sensor electrode in the first pixel row, and electrically connected to the first sensor circuit, a second sensor electrode in the first pixel row, and electrically connected to the second sensor circuit, a second-first pixel electrode in a second pixel row corresponding to the second circuit row, and electrically connected to the second-first pixel circuit, and a third sensor electrode in a third pixel row corresponding to the third circuit row, and electrically connected to the third sensor circuit.

The second sensor electrode may be spaced apart from the first sensor electrode in a first direction, wherein the third sensor electrode is spaced apart from the first sensor electrode in a second direction intersecting the first direction.

A gap between the first sensor electrode and the second sensor electrode may be substantially equal to a gap between the first sensor electrode and the third sensor electrode.

The display device may further include a fourth-first pixel circuit, a fourth-second pixel circuit, a fourth-third pixel circuit, and a fourth sensor circuit arranged in a fourth circuit row following the third circuit row, and a fourth sensor electrode in the third pixel row, and electrically connected to the fourth sensor circuit.

The fourth sensor electrode may be spaced apart from the third sensor electrode in the first direction, and is spaced apart from the second sensor electrode in the second direction.

A gap between the third sensor electrode and the fourth sensor electrode may be substantially equal to a gap between the second sensor electrode and the fourth sensor electrode.

The display device may further include a sensor connection electrode electrically connecting the first sensor circuit to the first sensor electrode.

The first-third pixel circuit may be between the first-first pixel electrode and the first sensor circuit, wherein the sensor connection electrode overlaps the first-third pixel circuit.

The sensor connection electrode may be integral with the first sensor electrode in a same layer.

The sensor connection electrode may be in a layer between the first sensor circuit and the first sensor electrode.

A width of each of the first-first pixel circuit, the first-second pixel circuit, and the first-third pixel circuit in a first direction may be greater than a width of the first sensor circuit in the first direction.

The first-first pixel circuit may include a first transistor for controlling a driving current supplied to the first-first pixel electrode, a second transistor for supplying a data voltage to a first electrode of the first transistor, a third transistor for electrically connecting a second electrode of the first transistor to a gate electrode of the first transistor, and a fourth transistor for supplying an initialization voltage to the gate electrode of the first transistor, wherein the first and second transistors include a silicon-based semiconductor region, and wherein the third and fourth transistors include an oxide-based semiconductor region.

The first sensor circuit may include a first sensor transistor including a gate electrode electrically connected to the first sensor electrode, a second sensor transistor supplying an initialization voltage to the gate electrode of the first sensor transistor, and a third sensor transistor electrically connecting the first sensor transistor to a read-out line, wherein the first and third sensor transistors include a silicon-based semiconductor region, and wherein the second sensor transistor includes an oxide-based semiconductor region.

According to one or more embodiments, a display device includes a first-first pixel circuit, a first-second pixel circuit, a first-third pixel circuit, a first-fourth pixel circuit, and a first sensor circuit arranged sequentially in a first circuit row, a second-first pixel circuit, a second-second pixel circuit, a second-third pixel circuit, a second-fourth pixel circuit, and a second sensor circuit arranged sequentially in a second circuit row following the first circuit row, a first-first pixel electrode in a first pixel row corresponding to the first circuit row, and electrically connected to the first-first pixel circuit, a first-second pixel electrode in the first pixel row, and electrically connected to the first-second pixel circuit, a first-third pixel electrode in the first pixel row, and electrically connected to the first-third pixel circuit, a first sensor electrode in the first pixel row, and electrically connected to the first sensor circuit, and a second sensor electrode in the first pixel row and electrically connected to the second sensor circuit.

The first sensor electrode may be at least partially surrounded by the first-first pixel electrode, the first-second pixel electrode, and the first-third pixel electrode.

The display device may further include a second-first pixel electrode in a second pixel row corresponding to the second circuit row, and electrically connected to the second-first pixel circuit, a second-second pixel electrode in the second pixel row, and electrically connected to the second-second pixel circuit, and a second-third pixel electrode in the second pixel row, and electrically connected to the second-third pixel circuit.

The first sensor electrode and the second sensor electrode may overlap the first circuit row, and do not overlap the second circuit row.

The display device may further include a third-first pixel circuit, a third-second pixel circuit, a third-third pixel circuit, a third-fourth pixel circuit, and a third sensor circuit arranged sequentially in a third circuit row following the second circuit row, a fourth-first pixel circuit, a fourth-second pixel circuit, a fourth-third pixel circuit, a fourth-fourth pixel circuit, and a fourth sensor circuit arranged sequentially in a fourth circuit row following the third circuit row, a third sensor electrode in a third pixel row corresponding to the third circuit row, and electrically connected to the third sensor circuit, and a fourth sensor electrode in the third pixel row, and electrically connected to the fourth sensor circuit.

The third sensor electrode and the fourth sensor electrode may overlap the third circuit row, and do not overlap the fourth circuit row.

A gap between the first sensor electrode and the second sensor electrode may be substantially equal to a gap between the first sensor electrode and the third sensor electrode.

In accordance with the display device according to embodiments, sensor circuits, in which a gap in a first direction and a gap in a second direction are different, and sensor areas, in which a gap in the first direction is substantially the same as a gap in the second direction, are included, so that it is possible to improve resolution of pixels while maintaining sensitivity of a fingerprint sensor without adding a mask process, and so that it is also possible to improve fingerprint sensitivity by reducing or minimizing sensing errors according to a finger's contact angle.

However, aspects according to the embodiments of the present disclosure are not limited to those described above, and various other aspects are incorporated herein.

BRIEF DESCRIPTION OF THE DRAWINGS

The above and other aspects of the present disclosure will become more apparent by describing in detail embodiments thereof with reference to the attached drawings, in which.

DETAILED DESCRIPTION

Figure 1:
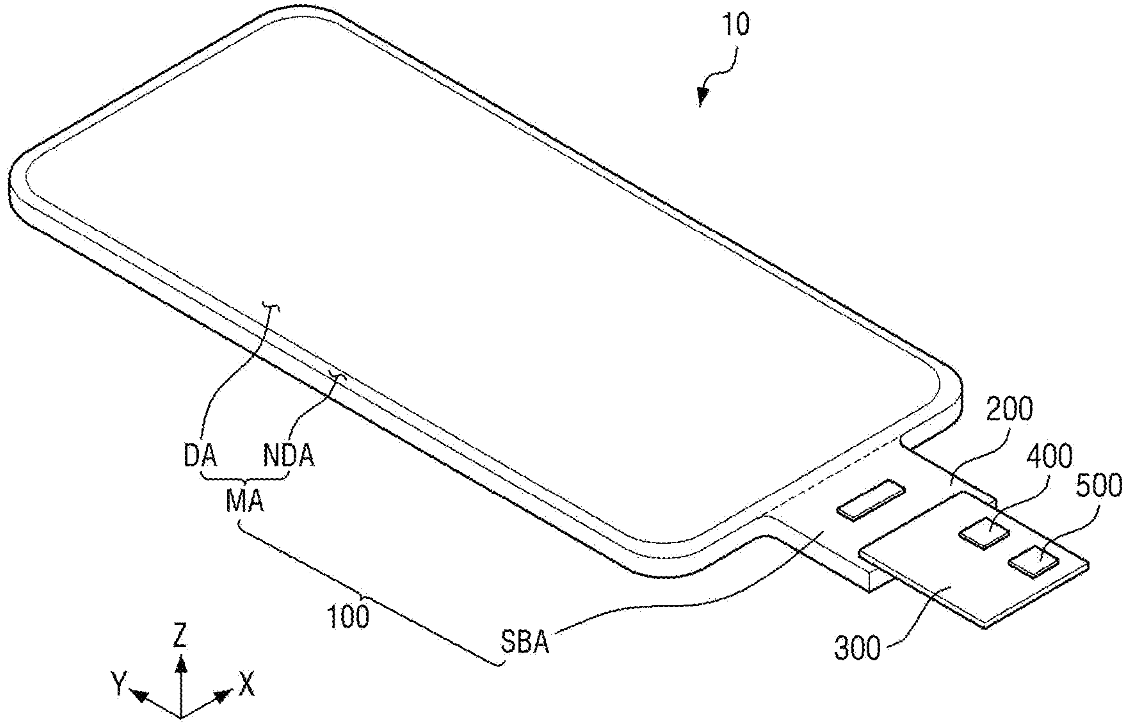
FIG. 1 is a perspective view showing a display device according to one or more embodiments.

In the following description, for the purposes of explanation, numerous specific details are set forth in order to provide a thorough understanding of various embodiments or implementations of the disclosure. As used herein "embodiments" and "implementations" are interchangeable words that are non-limiting examples of devices or methods employing one or more of the disclosure disclosed herein. It is apparent, however, that various embodiments may be practiced without these specific details or with one or more equivalent arrangements. In other instances, structures and devices are shown in block diagram form in order to avoid unnecessarily obscuring various embodiments. Further, various embodiments may be different, but do not have to be exclusive nor limit the disclosure. For example, specific shapes, configurations, and characteristics of one or more embodiments may be used or implemented in other embodiments without departing from the disclosure.

Unless otherwise specified, the illustrated embodiments are to be understood as providing features of varying detail of some ways in which the disclosure may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the disclosure.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified.

Further, in the accompanying drawings, the size and relative sizes of elements may be exaggerated for clarity and/or descriptive purposes. When one or more embodiments may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements.

Further, the X-axis, the Y-axis, and the Z-axis are not limited to three axes of a rectangular coordinate system, and thus the X-, Y-, and Z-axes, and may be interpreted in a broader sense. For example, the X-axis, the Y-axis, and the Z-axis may be perpendicular to one another, or may represent different directions that are not perpendicular to one another.

For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, ZZ, or the like. As used herein, the term "and/or" includes any and all combinations of one or more of the associated listed items.

Although the terms "first," "second," and the like may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein should be interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature, and the shapes of these regions may not reflect actual shapes of regions of a device and, as such, are not necessarily intended to be limiting.

As customary in the field, some embodiments are described and illustrated in the accompanying drawings in terms of functional blocks, units, parts, and/or modules. Those skilled in the art will appreciate that these blocks, units, parts, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, parts, and/or modules being implemented by microprocessors or other similar hardware, they may be programmed and controlled using software (e.g., microcode) to perform various functions discussed herein and may optionally be driven by firmware and/or software. It is also contemplated that each block, unit, part, and/or module may be implemented by dedicated hardware, or as a combination of dedicated hardware to perform some functions and a processor (e.g., one or more programmed microprocessors and associated circuitry) to perform other functions. Also, each block, unit, part, and/or module of some embodiments may be physically separated into two or more interacting and discrete blocks, units, parts, and/or modules without departing from the scope of the disclosure. Further, the blocks, units, parts, and/or modules of some embodiments may be physically combined into more complex blocks, units, parts, and/or modules without departing from the scope of the disclosure.

Unless otherwise defined or implied herein, all terms (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or excessively formal sense unless clearly so defined herein.

Hereinafter, detailed embodiments of the disclosure is described with reference to the accompanying drawings.

FIG. 1 is a perspective view showing a display device according to one or more embodiments.

Referring to FIG. 1, a display device 10 may be applied to portable electronic devices, such as a mobile phone, a smartphone, a tablet personal computer, a mobile communication terminal, an electronic organizer, an electronic book, a portable multimedia player (PMP), a navigation system, an ultra-mobile PC (UMPC) or the like. For example, the display device 10 may be applied as a display of a television, a laptop, a monitor, a billboard, or an Internet-of-Things (IoT) device. For another example, the display device 10 may be applied to wearable devices, such as a smart watch, a watch phone, a glasses type display, or a head mounted display (HMD).

The display device 10 may have a planar shape similar to a quadrilateral shape. For example, the display device 10 may have a shape similar to a quadrilateral shape, in plan view, having short sides in an X-axis direction and long sides in a Y-axis direction. The corner where the short side in the X-axis direction and the long side in the Y-axis direction meet may be rounded to have a curvature (e.g., predetermined curvature) or may be right-angled. The planar shape of the display device 10 is not limited to a quadrilateral shape, and may be formed in a shape similar to another polygonal shape, a circular shape, or elliptical shape.

The display device 10 may include a display panel 100, a display driver 200, a circuit board 300, a touch driver 400, and a power supply (e.g., power supply unit) 500.

The display panel 100 may include a main region MA and a sub-region SBA.

The main region MA may include the display area DA including pixels for displaying an image, and the non-display area NDA located around the display area DA. The display area DA may emit light from a plurality of emission areas or a plurality of opening areas. For example, the display panel 100 may include a pixel circuit including switching elements, a pixel-defining layer defining an emission area or an opening area, and a self-light-emitting element.

For example, the self-light-emitting element may include one of an organic light-emitting diode (LED) including an organic light-emitting layer, a quantum dot LED including a quantum dot light-emitting layer, an inorganic LED including an inorganic semiconductor, and a micro LED, but is not limited thereto.

The non-display area NDA may be an area outside the display area DA. The non-display area NDA may be defined as an edge area of the main region MA of the display panel 100. In one or more embodiments, the non-display area NDA may include a gate driver that supplies gate signals to the gate lines, and fan-out lines that connect the display driver 200 to the display area DA.

The sub-region SBA may extend from one side of the main region MA. The sub-region SBA may include a flexible material that can be bent, folded, or rolled. For example, when the sub-region SBA is bent, the sub-region SBA may overlap the main region MA in a thickness direction (Z-axis direction). The sub-region SBA may include the display driver 200 and a pad portion connected to the circuit board 300. Optionally, the sub-region SBA may be omitted, and the display driver 200 and the pad portion may be arranged in the non-display area NDA.

The display driver 200 may output signals and voltages for driving the display panel 100. The display driver 200 may supply data voltages to data lines. The display driver 200 may supply a power voltage to the power line, and may supply a gate control signal to the gate driver. The display driver 200 may receive a sensing signal through a read-out line. The display driver 200 may be formed as an integrated circuit (IC), and may be mounted on the display panel 100 by a chip-on-glass (COG) method, a chip-on-plastic (COP) method, or an ultrasonic bonding method. For example, the display driver 200 may be located in the sub-region SBA, and may overlap the main region MA in the thickness direction (Z-axis direction) by bending of the sub-region SBA. For another example, the display driver 200 may be mounted on the circuit board 300.

The circuit board 300 may be attached to the pad portion of the display panel 100 by using an anisotropic conductive film (ACF). Lead lines of the circuit board 300 may be electrically connected to the pad portion of the display panel 100. The circuit board 300 may be a flexible printed circuit board, a printed circuit board, or a flexible film, such as a chip on film.

The touch driver 400 may be mounted on the circuit board 300. The touch driver 400 may be electrically connected to a touch sensor (e.g., touch-sensing unit) of the display panel 100. The touch driver 400 may supply a touch-driving signal to a plurality of touch electrodes of the touch sensor, and may sense an amount of change in capacitance between the plurality of touch electrodes. For example, the touch-driving signal may be a pulse signal having a frequency (e.g., predetermined frequency). The touch driver 400 may calculate whether an input is made, and may input coordinates based on an amount of change in capacitance between the plurality of touch electrodes. The touch driver 400 may be formed as an integrated circuit (IC).

The power supply 500 may be located on the circuit board 300 to supply a power voltage to the display driver 200 and the display panel 100. The power supply 500 may generate a driving voltage to supply it to a driving voltage line, and may generate a common voltage to supply it to a common electrode that is common to the light-emitting elements of a plurality of pixels. For example, the driving voltage may be a high potential voltage for driving the light-emitting element, and the common voltage may be a low potential voltage for driving the light-emitting element. The power supply 500 may generate an initialization voltage to supply it to an initialization voltage line, may generate a reference voltage to supply it to a reference voltage line, may generate a bias voltage to supply it to a bias voltage line, and may generate a reset voltage to supply it to a reset voltage line.

Figure 2:
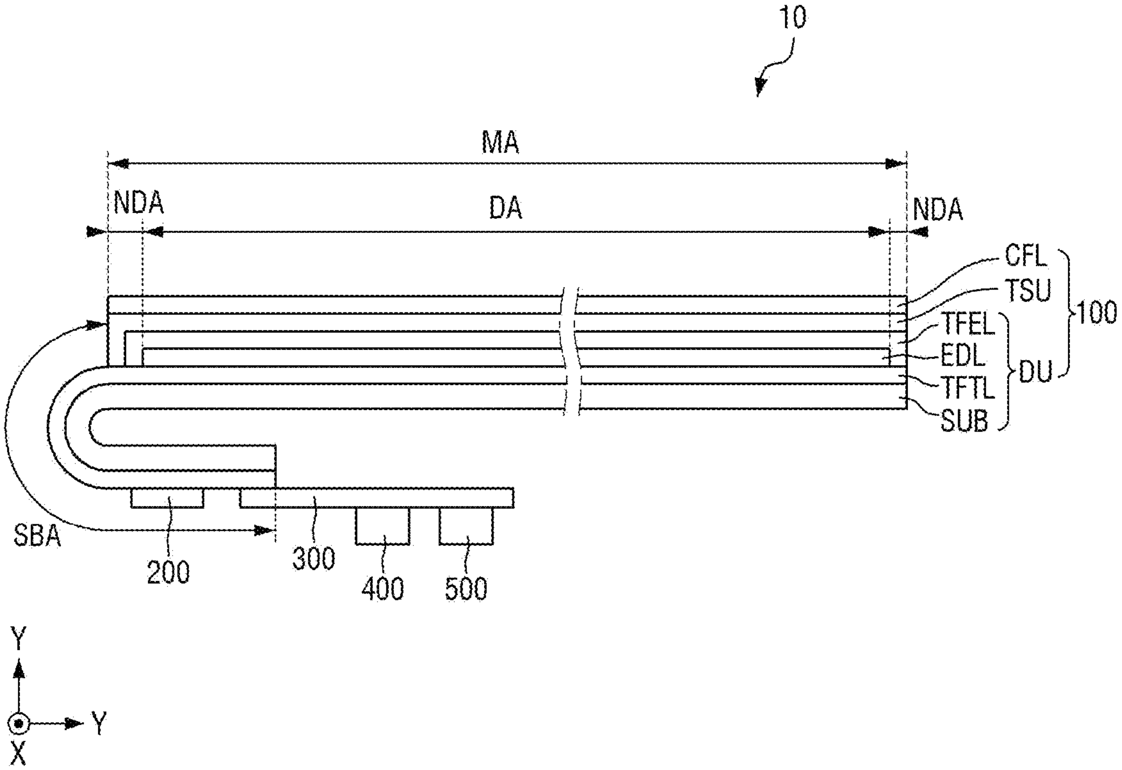
FIG. 2 is a cross-sectional view illustrating a display device according to one or more embodiments.

FIG. 2 is a cross-sectional view illustrating a display device according to one or more embodiments.

Referring to FIG. 2, the display panel 100 may include a display (e.g., display unit) DU, a touch sensor TSU, and a color filter layer CFL. The display DU may include a substrate SUB, a transistor layer TFTL, a light-emitting element layer EDL, and an encapsulation layer TFEL.

The substrate SUB may be a base substrate or a base member. The substrate SUB may be a flexible substrate that can be bent, folded, or rolled. For example, the substrate SUB may include a polymer resin, such as polyimide (PI), but is not limited thereto. For another example, the substrate SUB may include a glass material or a metal material.

The transistor layer TFTL may be located on the substrate SUB. The transistor layer TFTL may include a plurality of transistors constituting a pixel and a fingerprint sensor. The transistor layer TFTL may further include gate lines, data lines, power lines, read-out lines, gate control lines, fan-out lines that connect the display driver 200 to the data lines, and lead lines that connect the display driver 200 to the pad portion. Each of the transistors may include a semiconductor region, a source electrode, a drain electrode, and a gate electrode. For example, when the gate driver is formed on one side of the non-display area NDA of the display panel 100, the gate driver may include transistors.

The transistor layer TFTL may be located in the display area DA, the non-display area NDA, and the sub-region SBA. The transistors, gate lines, data lines, power lines, and read-out lines of the transistor layer TFTL may be located in the display area DA. Gate control lines and fan-out lines of the transistor layer TFTL may be located in the non-display area NDA. The lead lines of the transistor layer TFTL may be located in the sub-region SBA.

The light-emitting element layer EDL may be located on the transistor layer TFTL. The light-emitting element layer EDL may include a light-emitting element of the pixel, a light-receiving element of the fingerprint sensor, and a pixel-defining layer that defines the pixel and the fingerprint sensor. The light-emitting element may emit light by being formed of a pixel electrode, a light-emitting layer, and a common electrode sequentially stacked, and the light-receiving element may receive light by being formed of a sensor electrode, a light-receiving layer, and a common electrode sequentially stacked. The light-emitting elements and light-receiving elements of the light-emitting element layer EDL may be located in the display area DA.

For example, the light-emitting layer may be an organic light-emitting layer including an organic material. The light-emitting layer may include a hole-transporting layer, an organic light-emitting layer, and an electron-transporting layer. When the pixel electrode receives a voltage (e.g., predetermined voltage) through the transistor of the transistor layer TFTL while the common electrode receives a cathode voltage, holes may move to the organic light-emitting layer through the hole-transporting layer, electrons may move to the organic light-emitting layer through the electron-transporting layer, and the holes and the electrons may combine with each other in the organic light-emitting layer to emit light. For example, the pixel electrode may be an anode electrode, and the common electrode may be a cathode electrode, but the present disclosure is not limited thereto.

For another example, the plurality of light-emitting elements may include a quantum dot light-emitting diode including a quantum dot light-emitting layer, an inorganic light-emitting diode including an inorganic semiconductor, or a micro light-emitting diode.

The light-receiving element may receive light, and may convert light energy into an electrical signal. When a user's finger touches the display panel 100, light emitted from the light-emitting element may be reflected by the finger, and the light-receiving element may receive the reflected light. A sensing signal of the fingerprint sensor that receives light reflected by the ridges of the finger may be different from a sensing signal of the fingerprint sensor that receives light reflected by the valleys of the finger. The main processor may distinguish the difference between these sensing signals to generate sensing data, and based on the sensing data, may determine whether the ridges of the finger have been touched or the valleys of the finger have been touched. Accordingly, the display device 10 may recognize the pattern of the user's fingerprint based on the sensing data. For example, the light-receiving element may be an organic photodiode, but is not limited thereto.

The encapsulation layer TFEL may cover the top surface and the side surface of the light-emitting element layer EDL, and may protect the light-emitting element layer EDL. The encapsulation layer TFEL may include at least one inorganic layer and at least one organic layer for encapsulating the light-emitting element layer EDL.

The touch sensor TSU may be located on the encapsulation layer TFEL. The touch sensor TSU may include a plurality of touch electrodes for sensing a user's touch in a capacitive manner, and touch lines connecting the plurality of touch electrodes to the touch driver 400. The plurality of touch electrodes of the touch sensor TSU may be located in a touch sensor area overlapping the display area DA. The touch lines of the touch sensor TSU may be located in a touch peripheral area that overlaps the non-display area NDA. For example, the touch sensor TSU may sense the user's touch by using a mutual capacitance method or a self-capacitance method.

For another example, the touch sensor TSU may be located on a separate substrate located on the display DU. In this case, the substrate supporting the touch sensor TSU may be a base member that encapsulates the display DU.

The color filter layer CFL may be located on the touch sensor TSU. The color filter layer CFL may include a plurality of color filters respectively corresponding to the plurality of emission areas. Each of the color filters may selectively transmit light of a corresponding wavelength and may block or absorb light of a different wavelength. The color filter layer CFL may absorb a part of light coming from the outside of the display device 10 to reduce reflected light due to external light. Accordingly, the color filter layer CFL may reduce or prevent color distortion caused by reflection of the external light.

Because the color filter layer CFL is directly located on the touch sensor TSU, the display device 10 may not require a separate substrate for the color filter layer CFL. Therefore, the thickness of the display device 10 may be relatively reduced.

The sub-region SBA of the display panel 100 may extend from one side of the main region MA. The sub-region SBA may include a flexible material that can be bent, folded, or rolled. For example, when the sub-region SBA is bent, the sub-region SBA may overlap the main region MA in a thickness direction (Z-axis direction). The sub-region SBA may include the display driver 200 and the pad portion electrically connected to the circuit board 300.

Figure 3:
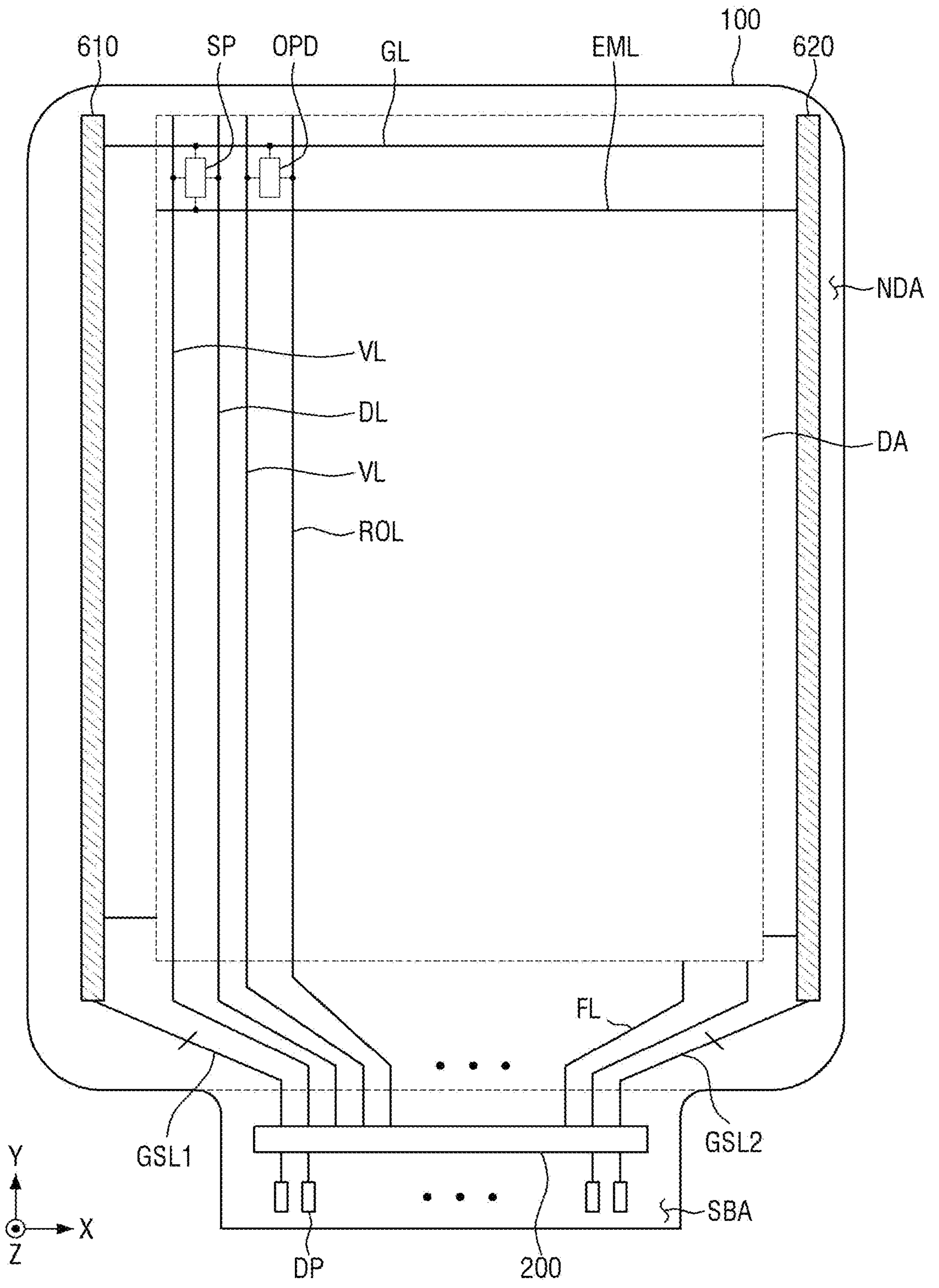
FIG. 3 is a plan view illustrating a display of a display device according to one or more embodiments.
Figure 4:
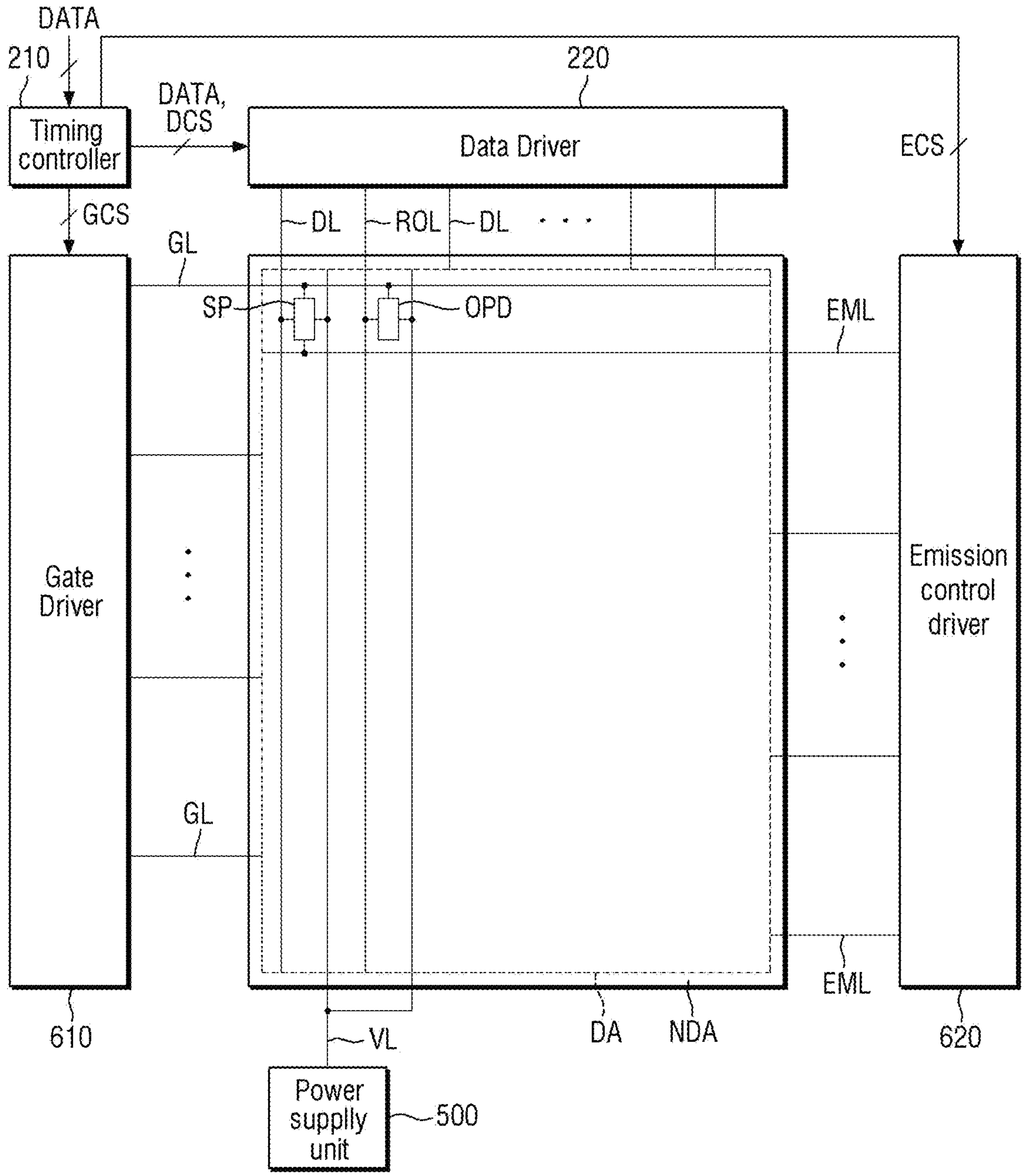
FIG. 4 is a block diagram illustrating a display panel and a display driver according to one or more embodiments.

FIG. 3 is a plan view illustrating a display of a display device according to one or more embodiments. FIG. 4 is a block diagram illustrating a display panel and a display driver according to one or more embodiments.

Referring to FIGS. 3 and 4, the display panel 100 may include the display area DA, the non-display area NDA, and the sub-region SBA. The display area DA may include pixels SP, fingerprint sensors OPD, power lines VL, data lines DL, read-out lines ROL, gate lines GL, and emission control lines EML.

Each of the plurality of pixels SP may be connected to the gate line GL, the emission control line EML, the data line DL, and the power line VL. Each of the pixels SP may include at least one transistor, a light-emitting element, and a capacitor.

Each of the plurality of fingerprint sensors OPD may be connected to the gate line GL, the power line VL, and the read-out line ROL. Each of the plurality of fingerprint sensors OPD may include at least one transistor and the light-receiving element.

The gate lines GL may extend in the X-axis direction, and may be spaced apart from each other in the Y-axis direction that crosses the X-axis direction. The gate lines GL may sequentially supply gate signals to the pixels SP and the fingerprint sensors OPD.

The emission control lines EML may extend in the X-axis direction, and may be spaced apart from each other in the Y-axis direction. The emission control lines EML may sequentially supply emission signals to the pixels SP.

The data lines DL may extend in the Y-axis direction, and may be spaced apart from each other in the X-axis direction. The data lines DL may supply the data voltage to the pixels SP. The data voltage may determine the luminance of each of the pixels SP.

The power lines VL may extend in the Y-axis direction, and may be spaced apart from each other in the X-axis direction. The power line VL may supply a power voltage to the pixels SP and the fingerprint sensors OPD. Here, the power voltage may be a driving voltage, a common voltage, an initialization voltage, a reference voltage, a bias voltage, or a reset voltage. The driving voltage may be a high potential voltage for driving the light-emitting element, and the common voltage may be a low potential voltage for driving the light-emitting element and the light-receiving element.

The non-display area NDA may surround the display area DA. The non-display area NDA may include a gate driver 610, an emission control driver 620, fan-out lines FL, a first gate control line GSL1, and a second gate control line GSL2.

The fan-out lines FL may extend from the display driver 200 to the display area DA. The fan-out lines FL may supply the data voltage received from the display driver 200 to the data line DL, may supply the power voltage received from the display driver 200 to the power line VL, and may supply the sensing signal received from the read-out line ROL to the display driver 200. Accordingly, the display driver 200 may drive the pixel SP and the fingerprint sensor OPD.

The first gate control line GSL1 may extend from the display driver 200 to the gate driver 610. The first gate control line GSL1 may supply a gate control signal GCS received from the display driver 200 to the gate driver 610.

The second gate control line GSL2 may extend from the display driver 200 to the emission control driver 620. The second gate control line GSL2 may supply an emission control signal ECS received from the display driver 200 to the emission control driver 620.

The sub-region SBA may extend from one side of the non-display area NDA. The sub-region SBA may include the display driver 200 and the pad portion DP. The pad portion DP may be closer to one edge of the sub-region SBA than the display driver 200. The pad portion DP may be electrically connected to the circuit board 300 through an anisotropic conductive film ACF.

The display driver 200 may include a timing controller 210 and a data driver 220.

The timing controller 210 may receive digital video data DATA and timing signals from the circuit board 300. The timing controller 210 may generate, based on the timing signals, a data control signal DCS to control the operation timing of the data driver 220, the gate control signal GCS to control the operation timing of the gate driver 610, and the emission control signal ECS to control the operation timing of the emission control driver 620. The timing controller 210 may supply the gate control signal GCS to the gate driver 610 through the first gate control line GSL1. The timing controller 210 may supply the emission control signal ECS to the emission control driver 620 through the second gate control line GSL2. The timing controller 210 may supply the digital video data DATA and the data control signal DCS to the data driver 220.

The data driver 220 may convert the digital video data DATA into analog data voltages, and may supply the analog data voltages to the data lines DL through the fan-out lines FL. The gate signals of the gate driver 610 may select pixels SP to which the data voltage is supplied, and the selected pixels SP may receive the data voltage through the data lines DL. The data driver 220 may supply a sensing signal received through the read-out line ROL to the main processor.

The power supply 500 may be located on the circuit board 300 to supply a power voltage to the display driver 200 and the display panel 100. The power supply 500 may generate a power voltage to supply it to the power line VL, and may generate a common voltage to supply it to the common electrode that is common to the pixels SP and the fingerprint sensors OPD. The power supply 500 may generate an initialization voltage to supply it to an initialization voltage line, may generate a reference voltage to supply it to a reference voltage line, may generate a bias voltage to supply it to a bias voltage line, and may generate a reset voltage to supply it to a reset voltage line.

The gate driver 610 may be located at one external side of the display area DA or at one side of the non-display area NDA. The emission control driver 620 may be located at the other external side of the display area DA or at the other side of the non-display area NDA. However, the present disclosure is not limited thereto. As another example, the gate driver 610 and the emission control driver 620 may be located at any one of one side and the other side of the non-display area NDA.

The gate driver 610 may include a plurality of transistors for generating gate signals based on the gate control signal GCS. The emission control driver 620 may include a plurality of transistors for generating emission signals based on the emission control signal ECS. For example, the transistors of the gate driver 610 and the transistors of the emission control driver 620 may be formed in the same layer as the transistors of each pixel SP. The gate driver 610 may supply the gate signals to the gate lines GL, and the emission control driver 620 may supply the emission signals to the emission control lines EML.

Figure 5:
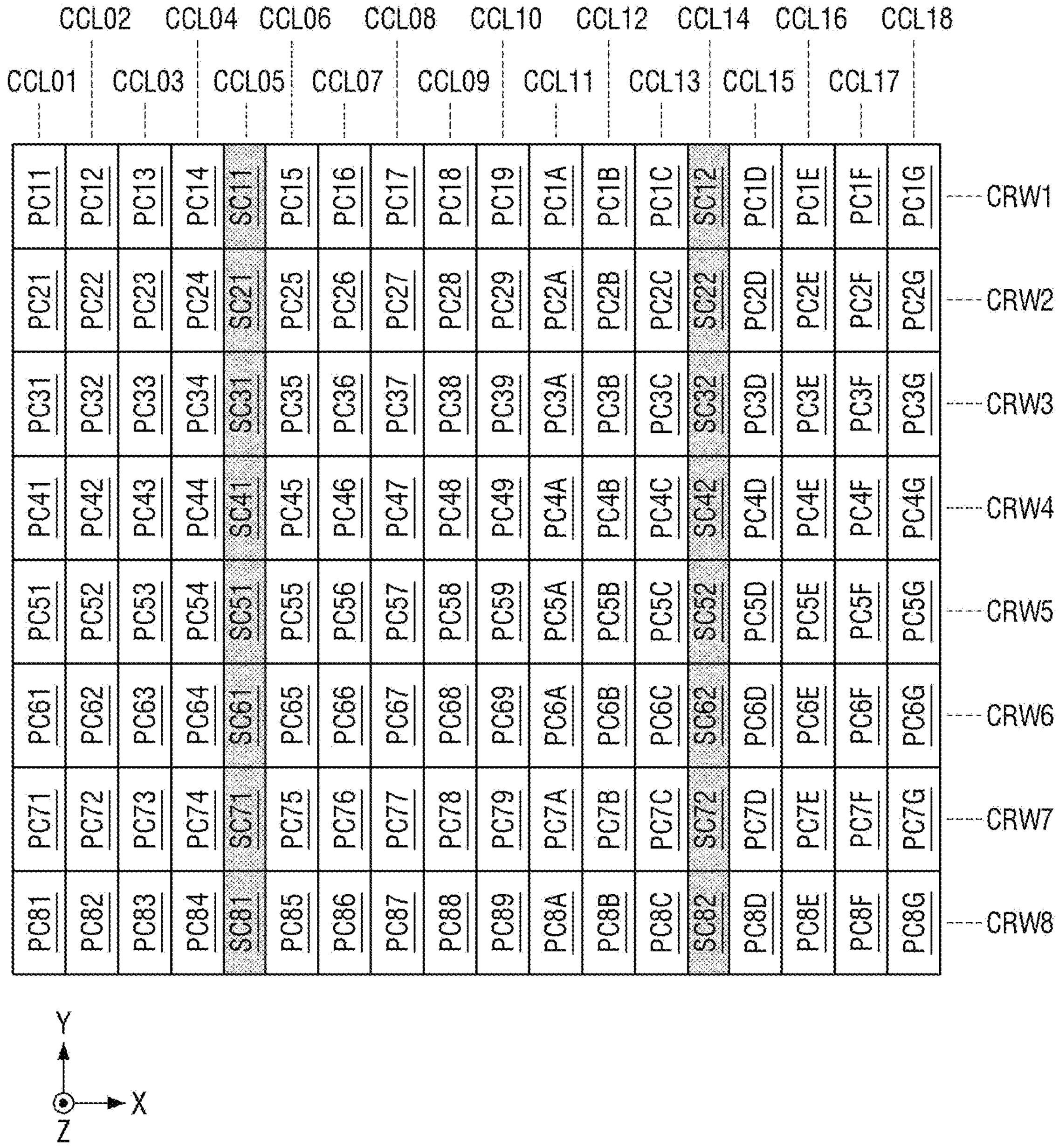
FIG. 5 is a plan view showing a pixel circuit and a sensor circuit of a display device according to one or more embodiments.

FIG. 5 is a plan view showing a pixel circuit and a sensor circuit of a display device according to one or more embodiments.

Referring to FIG. 5, a plurality of pixel circuits and a plurality of sensor circuits may be arranged along a plurality of rows and columns in the display area DA. For example, the pixel circuits and the sensor circuits may be arranged along first to eighth circuit rows CRW1, CRW2, CRW3, CRW4, CRW5, CRW6, CRW7, and CRW8 and first to eighteenth circuit columns CCL01, CCL02, CCL03, CCL04, CCL05, CCL06, CCL07, CCL08, CCL09, CCL10, CCL11, CCL12, CCL13, CCL14, CCL15, CCL16, CCL17, and CCL18. The pixel circuits and the sensor circuits may be located at a corresponding ratio in the display area DA. The display area DA includes the pixel circuits and the sensor circuits that are arranged at a corresponding ratio, and thus may include the pixel SP and the fingerprint sensor OPD that are located in the same layer. For example, the pixel circuits and the sensor circuits may be located at a ratio of 8:1, but the present disclosure is not limited thereto. Accordingly, the display device 10 may improve the resolution of the pixels SP while maintaining the sensitivity of the fingerprint sensor OPD.

The first circuit row CRW1 may include eleventh to 1G pixel circuits PC11, PC12, PC13, PC14, PC15, PC16, PC17, PC18, PC19, PC1A, PC1B, PC1C, PC1D, PC1E, PC1F, and PC1G and eleventh and twelfth sensor circuits SC11 and SC12. The eleventh sensor circuit SC11 may be located between the fourteenth pixel circuit PC14 and the fifteenth pixel circuit PC15, and the twelfth sensor circuit SC12 may be located between the 1C pixel circuit PC1C and the 1D pixel circuit PC1D.

The second circuit row CRW2 may include twenty-first to 2G pixel circuits PC21, PC22, PC23, PC24, PC25, PC26, PC27, PC28, PC29, PC2A, PC2B, PC2C, PC2D, PC2E, PC2F, and PC2G and twenty-first and twenty-second sensor circuits SC21 and SC22. The twenty-first sensor circuit SC21 may be located between the twenty-fourth pixel circuit PC24 and the twenty-fifth pixel circuit PC25, and the twenty-second sensor circuit SC22 may be located between the 2C pixel circuit PC2C and the 2D pixel circuit PC2D.

The third circuit row CRW3 may include thirty-first to 3G pixel circuits PC31, PC32, PC33, PC34, PC35, PC36, PC37, PC38, PC39, PC3A, PC3B, PC3C, PC3D, PC3E, PC3F, and PC3G and thirty-first and thirty-second sensor circuits SC31 and SC32. The thirty-first sensor circuit SC31 may be located between the thirty-fourth pixel circuit PC34 and the thirty-fifth pixel circuit PC35, and the thirty-second sensor circuit SC32 may be located between the 3C pixel circuit PC3C and the 3D pixel circuit PC3D.

The fourth circuit row CRW4 may include forty-first to 4G pixel circuits PC41, PC42, PC43, PC44, PC45, PC46, PC47, PC48, PC49, PC4A, PC4B, PC4C, PC4D, PC4E, PC4F, and PC4G and forty-first and forty-second sensor circuits SC41 and SC42. The forty-first sensor circuit SC41 may be located between the forty-fourth pixel circuit PC44 and the forty-fifth pixel circuit PC45, and the forty-second sensor circuit SC42 may be located between the 4C pixel circuit PC4C and the 4D pixel circuit PC4D.

The fifth circuit row CRW5 may include fifty-first to 5G pixel circuits PC51, PC52, PC53, PC54, PC55, PC56, PC57, PC58, PC59, PC5A, PC5B, PC5C, PC5D, PC5E, PC5F, and PC5G and fifty-first and fifty-second sensor circuits SC51 and SC52. The fifty-first sensor circuit SC51 may be located between the fifty-fourth pixel circuit PC54 and the fifty-fifth pixel circuit PC55, and the fifty-second sensor circuit SC52 may be located between the 5C pixel circuit PC5C and the 5D pixel circuit PC5D.

The sixth circuit row CRW6 may include sixty-first to 6G pixel circuits PC61, PC62, PC63, PC64, PC65, PC66, PC67, PC68, PC69, PC6A, PC6B, PC6C, PC6D, PC6E, PC6F, and PC6G and sixty-first and sixty-second sensor circuits SC61 and SC62. The sixty-first sensor circuit SC61 may be located between the sixty-fourth pixel circuit PC64 and the sixty-fifth pixel circuit PC65, and the sixty-second sensor circuit SC62 may be located between the 6C pixel circuit PC6C and the 6D pixel circuit PC6D.

The seventh circuit row CRW7 may include seventy-first to 7G pixel circuits PC71, PC72, PC73, PC74, PC75, PC76, PC77, PC78, PC79, PC7A, PC7B, PC7C, PC7D, PC7E, PC7F, and PC7G and seventy-first and seventy-second sensor circuits SC71 and SC72. The seventy-first sensor circuit SC71 may be located between the seventy-fourth pixel circuit PC74 and the seventy-fifth pixel circuit PC75, and the seventy-second sensor circuit SC72 may be located between the 7C pixel circuit PC7C and the 7D pixel circuit PC7D.

The eighth circuit row CRW8 may include eighty-first to 8G pixel circuits PC81, PC82, PC83, PC84, PC85, PC86, PC87, PC88, PC89, PC8A, PC8B, PC8C, PC8D, PC8E, PC8F, and PC8G and eighty-first and eighty-second sensor circuits SC81 and SC82. The eighty-first sensor circuit SC81 may be located between the eighty-fourth pixel circuit PC84 and the eighty-fifth pixel circuit PC85, and the eighty-second sensor circuit SC82 may be located between the 8C pixel circuit PC8C and the 8D pixel circuit PC8D.

Figure 6:
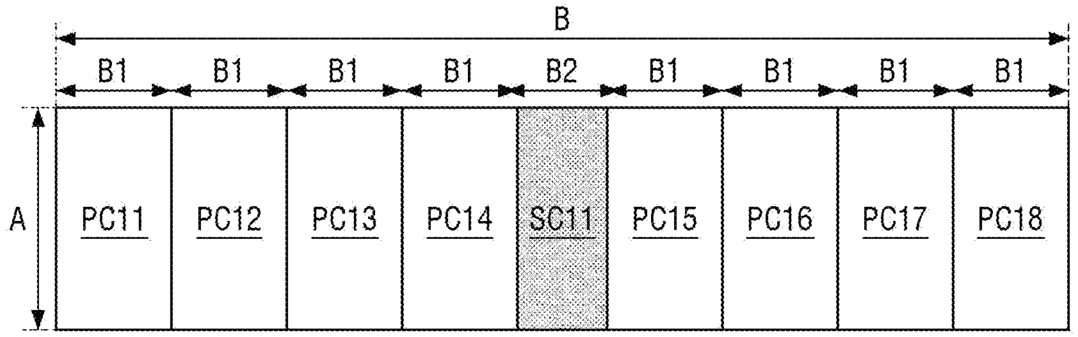
FIG. 6 is a plan view of a pixel circuit and a sensor circuit that are located in a unit area in a display device according to one or more embodiments.

FIG. 6 is a plan view of a pixel circuit and a sensor circuit that are located in a unit area in a display device according to one or more embodiments.

Referring to FIG. 6, the pixel circuits and the sensor circuits may be located at a constant ratio in the display area DA. The pixel circuits may have the same size, and the sensor circuits may have the same size. The pixel circuits and the sensor circuits may be located at a ratio of 8:1. For example, the unit area may include eight pixel circuits PC11, PC12, PC13, PC14, PC15, PC16, PC17, and PC18 and one sensor circuit SC11.

For example, if the Y-axis direction length of the unit area is "A," the Y-axis direction length of each of the eleventh to eighteenth pixel circuits PC11, PC12, PC13, PC14, PC15, PC16, PC17, and PC18 and the eleventh sensor circuit SC11 may be "A." If the X-axis direction length of the unit area is "B," the X-axis direction length of the eleventh pixel circuit PC11 is "B1," and the X-axis direction length of the eleventh sensor circuit SC11 is "B2," "$B=8\times B1+B2$" may be satisfied. When the unit area is fixed, the number of pixel circuits may increase as the number of sensor circuits decreases, and the number of pixel circuits may decrease as the number of sensor circuits increases. Accordingly, the display device 10 includes the pixel circuits and the sensor circuits that are located at a constant ratio, so that the resolution of the pixels SP may be improved while maintaining the sensitivity of the fingerprint sensor OPD without adding a mask process.

Figure 7:
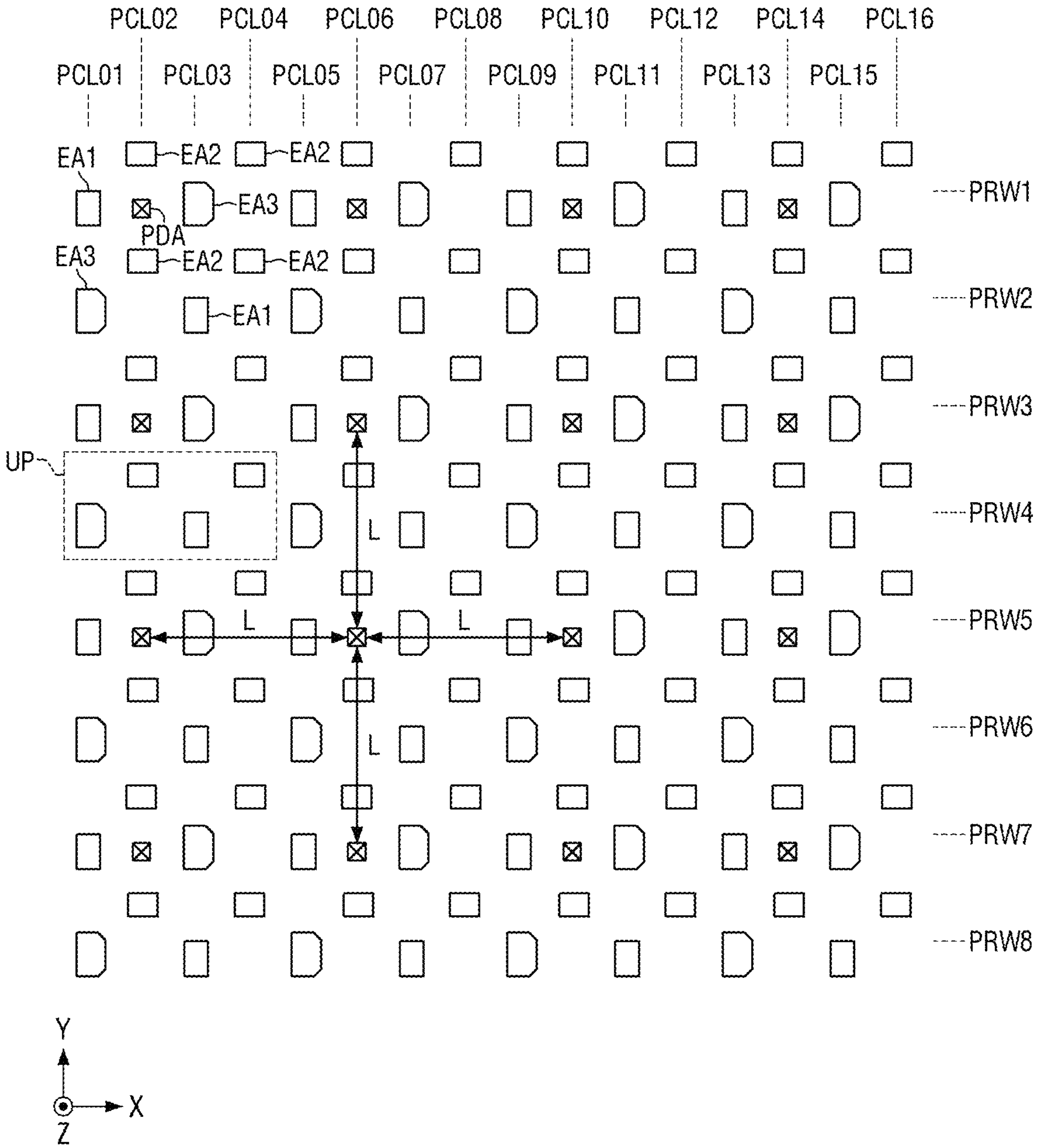
FIG. 7 is a plan view illustrating an emission area and a sensor area in a display device according to one or more embodiments.

FIG. 7 is a plan view illustrating an emission area and a sensor area in a display device according to one or more embodiments.

Referring to FIG. 7, the display area DA may include first to third emission areas EA1, EA2, and EA3 and a sensor area PDA. Each of the first to third emission areas EA1, EA2, and EA3 may emit light of light-emitting elements. For example, the first emission area EA1 may emit light of a first color or red light, the second emission area EA2 may emit light of a second color or green light, and the third emission area EA3 may emit light of a third color or blue light, but is not limited thereto.

One unit pixel UP may represent white gray scale by including one first emission area EA1, two second emission areas EA2, and one third emission area EA3, but the configuration of the unit pixel UP is not limited thereto. The white gray scale may be represented by a combination of light emitted from one first emission area EA1, light emitted from two second emission areas EA2, and light emitted from one third emission area EA3.

The first to third emission areas EA1, EA2, and EA3 may be different in size from each other. For example, the size of the third emission area EA3 may be larger than that of the first emission area EA1, and the size of the first emission area EA1 may be larger than that of the second emission area EA2. However, the present disclosure is not limited thereto. As another example, the sizes of the first to third emission areas EA1, EA2, and EA3 may be the same.

The sensor area PDA may be surrounded by the first to third emission areas EA1, EA2, and EA3. The sensor area PDA may be adjacent to the first or third emission area EA1 or EA3 in the X-axis direction, and may be adjacent to the second emission area EA2 in the Y-axis direction. The sensor areas PDA may be spaced apart from each other with at least one of the first to third emission areas EA1, EA2, and/or EA3 interposed therebetween. The sensor area PDA may receive light reflected by the finger.

The first to third emission areas EA1, EA2, and EA3 and the sensor area PDA may be arranged along a plurality of rows and columns. For example, the first to third emission areas EA1, EA2, and EA3 and the sensor area PDA may be arranged along first to eighth pixel rows PRW1, PRW2, PRW3, PRW4, PRW5, PRW6, PRW7, and PRW8 and first to sixteenth pixel columns PCL01, PCL02, PCL03, PCL04, PCL05, PCL06, PCL07, PCL08, PCL09, PCL10, PCL11, PCL12, PCL13, PCL14, PCL15, and PCL16.

The first to third emission areas EA1, EA2, and EA3 and the sensor area PDA may be located at a corresponding ratio in the display area DA. The display area DA includes the first to third emission areas EA1, EA2, and EA3 and the sensor area PDA that are located at a corresponding ratio, and thus may include the pixel SP and the fingerprint sensor OPD that are located in the same layer. The unit pixel UP and the fingerprint sensor OPD may be located at a ratio of 4:2, but the present disclosure is not limited thereto. For example, the areas of the first and second pixel rows PRW1 and PRW2 and the first to eighth pixel columns PCL01, PCL02, PCL03, PCL04, PCL05, PCL06, PCL07, and PCL08 may include four unit pixels UP and two fingerprint sensors OPD.

The plurality of sensor areas PDA may be arranged at the same gap L in the X-axis direction and the Y-axis direction. For example, the gap L between the sensor areas PDA adjacent in the X-axis direction may be substantially the same as the gap L between the sensor areas PDA adjacent in the Y-axis direction. The gap in the X-axis direction and the gap in the Y-axis direction of the sensor electrodes respectively corresponding to the sensor areas PDA may be substantially the same. Accordingly, in the display device 10, in the case of sensing a user's fingerprint, the fingerprint sensitivity may be improved by reducing or minimizing sensing errors according to a finger's contact angle.

The first to third emission areas EA1, EA2, and EA3 and the sensor area PDA of FIG. 7 may correspond to the pixel circuit and the sensor circuit of FIG. 5. FIG. 5 may include 128 pixel circuits and 16 sensor circuits, and FIG. 7 may include 128 emission areas and 16 sensor areas. For example, the sensor area PDA located in the first pixel row PRW1 and the second pixel column PCL02 may correspond to the eleventh sensor circuit SC11 located in the first circuit row CRW1 and the fifth circuit column CCL05. The sensor area PDA located in the first pixel row PRW1 and the sixth pixel column PCL06 may correspond to the twenty-first sensor circuit SC21 located in the second circuit row CRW2 and the fifth circuit column CCL05. The sensor area PDA located in the first pixel row PRW1 and the tenth pixel column PCL10 may correspond to the twelfth sensor circuit SC12 located in the first circuit row CRW1 and the fourteenth circuit column CCL14. The sensor area PDA located in the first pixel row PRW1 and the fourteenth pixel column PCL14 may correspond to the twenty-second sensor circuit SC22 located in the second circuit row CRW2 and the fourteenth circuit column CCL14.

The gap between the eleventh sensor circuit SC11 and the twelfth sensor circuit SC12 adjacent in the X-axis direction and the gap between the eleventh sensor circuit SC11 and the twenty-first sensor circuit SC21 adjacent in the Y-axis direction may be different from each other. The eleventh and twelfth sensor circuits SC11 and SC12 may be spaced apart from each other with eight pixel circuits interposed therebetween in the X-axis direction, and the eleventh and twenty-first sensor circuits SC11 and SC21 may be directly adjacent to each other in the Y-axis direction. The display device includes a sensor connection electrode, so that a sensor circuit and a light-receiving element spaced apart from each other in plan view may be electrically connected. Therefore, the display device 10 includes the sensor circuits in which the gap in the X-axis direction and the gap in the Y-axis direction are different from each other, and the sensor areas PDA in which the gap L in the X-axis direction and the gap L in the Y-axis direction are substantially the same, so that it is possible to improve the resolution of the pixels SP while maintaining the sensitivity of the fingerprint sensor OPD without adding a mask process, and so that it is also possible to improve the fingerprint sensitivity by reducing or minimizing sensing errors according to a finger's contact angle.

Figure 8:
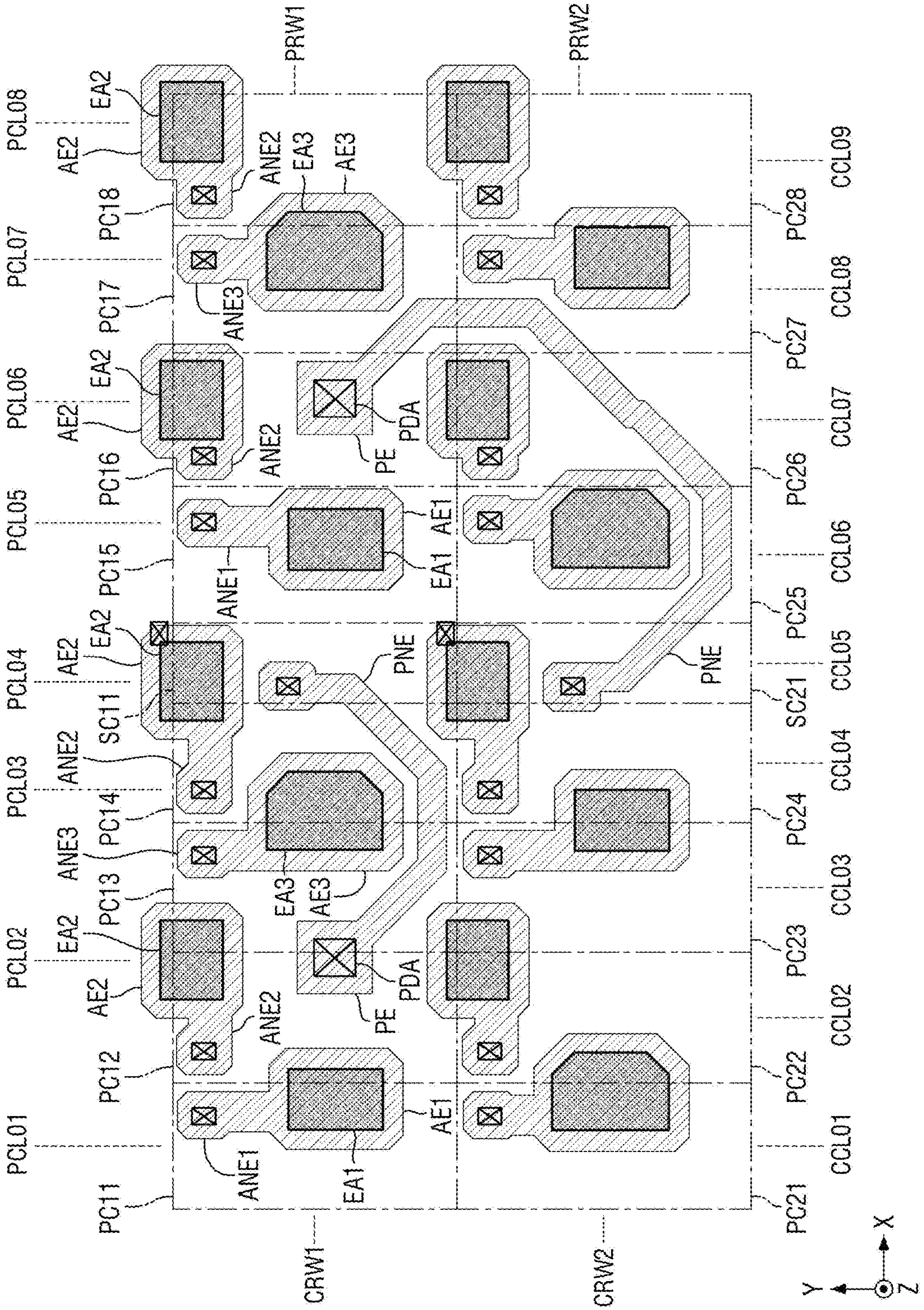
FIG. 8 is a plan view showing a pixel circuit, a sensor circuit, a pixel electrode, an anode connection electrode, a sensor electrode, and a sensor connection electrode of a display device according to one or more embodiments.

FIG. 8 is a plan view showing a pixel circuit, a sensor circuit, a pixel electrode, an anode connection electrode, a sensor electrode, and a sensor connection electrode of a display device according to one or more embodiments.

Referring to FIG. 8, a plurality of pixel circuits and a plurality of sensor circuits may be arranged along a plurality of rows and columns in the display area DA. For example, the pixel circuits and the sensor circuits may be arranged along the first and second circuit rows CRW1 and CRW2 and the first to ninth circuit columns CCL01, CCL02, CCL03, CCL04, CCL05, CCL06, CCL07, CCL08, and CCL09. The pixel circuits and the sensor circuits may be located at a corresponding ratio in the display area DA. The display area DA includes the pixel circuits and the sensor circuits that are located at a corresponding ratio, and thus may include the pixel SP and the fingerprint sensor OPD that are located in the same layer. For example, the pixel circuits and the sensor circuits may be located at a ratio of 8:1, but the present disclosure is not limited thereto. Accordingly, the display device 10 may improve the resolution of the pixels SP while maintaining the sensitivity of the fingerprint sensor OPD without adding a mask process.

The first to third emission areas EA1, EA2, and EA3 and the sensor area PDA may be arranged along a plurality of rows and columns. For example, the first to third emission areas EA1, EA2, and EA3 and the sensor area PDA may be arranged along the first and second pixel rows PRW1 and PRW2 and the first to eighth pixel columns PCL01, PCL02, PCL03, PCL04, PCL05, PCL06, PCL07, and PCL08.

The first to third emission areas EA1, EA2, and EA3 and the sensor area PDA may be located at a corresponding ratio in the display area DA. The display area DA includes the first to third emission areas EA1, EA2, and EA3 and the sensor area PDA that are located at a corresponding ratio, and thus may include the pixel SP and the fingerprint sensor OPD that are located in the same layer. The unit pixel UP and the fingerprint sensor OPD may be located at a ratio of 4:2, but the present disclosure is not limited thereto. For example, the areas of the first and second pixel rows PRW1 and PRW2 and the first to eighth pixel columns PCL01, PCL02, PCL03, PCL04, PCL05, PCL06, PCL07, and PCL08 may include four unit pixels UP and two fingerprint sensors OPD.

The four unit pixels UP may correspond to the eleventh to eighteenth pixel circuits PC11, PC12, PC13, PC14, PC15, PC16, PC17, and PC18 and the twenty-first to twenty-eighth pixel circuits PC21, PC22, PC23, PC24, PC25, PC26, PC27, and PC28. The two fingerprint sensors OPD may correspond to the eleventh and twenty-first sensor circuits SC11 and SC21.

The eleventh pixel circuit PC11 may be electrically connected to a first pixel electrode AE1 located in the first pixel row PRW1 and the first pixel column PCL01 through a first anode connection electrode ANE1. The first anode connection electrode ANE1 may be formed integrally with the first pixel electrode AE1 in the same layer.

The twelfth pixel circuit PC12 may be electrically connected to a second pixel electrode AE2 located in the first pixel row PRW1 and the second pixel column PCL02 through a second anode connection electrode ANE2. The second anode connection electrode ANE2 may be formed integrally with the second pixel electrode AE2 in the same layer.

The thirteenth pixel circuit PC13 may be electrically connected to a third pixel electrode AE3 located in the first pixel row PRW1 and the third pixel column PCL03 through a third anode connection electrode ANE3. The third anode connection electrode ANE3 may be formed integrally with the third pixel electrode AE3 in the same layer.

The fourteenth pixel circuit PC14 may be electrically connected to the second pixel electrode AE2 located in the first pixel row PRW1 and the fourth pixel column PCL04 through the second anode connection electrode ANE2. The second anode connection electrode ANE2 may be formed integrally with the second pixel electrode AE2 in the same layer.

The fifteenth pixel circuit PC15 may be electrically connected to the first pixel electrode AE1 located in the first pixel row PRW1 and the fifth pixel column PCL05 through the first anode connection electrode ANE1. The sixteenth pixel circuit PC16 may be electrically connected to the second pixel electrode AE2 located in the first pixel row PRW1 and the sixth pixel column PCL06 through the second anode connection electrode ANE2.

The seventeenth pixel circuit PC17 may be electrically connected to the third pixel electrode AE3 located in the first pixel row PRW1 and the seventh pixel column PCL07 through the third anode connection electrode ANE3. The eighteenth pixel circuit PC18 may be electrically connected to the second pixel electrode AE2 located in the first pixel row PRW1 and the eighth pixel column PCL08 through the second anode connection electrode ANE2.

The first pixel row PRW1 may include a first sub-row and a second sub-row. The second pixel electrodes AE2 and the second emission areas EA2 may be arranged in the first sub-row. The first pixel electrodes AE1 and the third pixel electrodes AE3 may be alternately arranged in the second sub-row. The first emission areas EA1 and the third emission areas EA3 may be alternately arranged in the second sub-row.

The eleventh sensor circuit SC11 may be electrically connected to a sensor electrode PE located in the first pixel row PRW1 and the second pixel column PCL02 through a sensor connection electrode PNE. The sensor connection electrode PNE may be formed integrally with the sensor electrode PE in the same layer. The eleventh sensor circuit SC11 and the sensor electrode PE may be spaced apart from each other with the thirteenth and fourteenth pixel circuits PC13 and PC14 interposed therebetween. The sensor connection electrode PNE may overlap the thirteenth and fourteenth pixel circuits PC13 and PC14. The sensor electrode PE may be adjacent to the first and third pixel electrodes AE1 and AE3 in the X-axis direction, and may be adjacent to the second pixel electrodes AE2 in the Y-axis direction.

The twenty-first sensor circuit SC21 may be electrically connected to the sensor electrode PE located in the first pixel row PRW1 and the sixth pixel column PCL06 through the sensor connection electrode PNE. The sensor connection electrode PNE may be formed integrally with the sensor electrode PE in the same layer. The sensor electrode PE located in the first pixel row PRW1 and the sixth pixel column PCL06 may overlap the sixteenth pixel circuit PC16. The twenty-first sensor circuit SC21 and the sensor electrode PE may be spaced apart from each other with the fifteenth and twenty-fifth pixel circuits PC15 and PC25 interposed therebetween. The sensor connection electrode PNE may overlap the twenty-fifth, twenty-sixth, twenty-seventh, seventeenth, and sixteenth pixel circuits PC25, PC26, PC27, PC17, and PC16.

The eleventh and twenty-first sensor circuits SC11 and SC21 may be adjacent to each other in the Y-axis direction, and the sensor electrodes PE electrically connected to each of the eleventh and twenty-first sensor circuits SC11 and SC21 may be spaced apart from each other with a plurality of pixel circuits interposed therebetween in the X-axis direction. The sensor connection electrode PNE may electrically connect each of the eleventh and twenty-first sensor circuits SC11 and SC21 that are spaced apart from each other in plan view to the sensor electrodes PE. Therefore, the display device 10 includes the sensor circuits in which the gap in the X-axis direction and the gap in the Y-axis direction are different from each other, and the sensor areas PDA in which the gap L in the X-axis direction and the gap L in the Y-axis direction are substantially the same, so that it is possible to improve the resolution of the pixels SP while maintaining the sensitivity of the fingerprint sensor OPD without adding a mask process, and also possible to improve the fingerprint sensitivity by reducing or minimizing sensing errors according to a finger's contact angle.

FIG. 8 illustrates the connection relationship between the pixel circuit and the sensor circuit that are located in the first and second circuit rows CRW1 and CRW2 of FIG. 5, and the first to third pixel electrodes AE1, AE2, and AE3 and the sensor electrode PE that are located in the first and second circuit rows PRW1 and PRW2 of FIG. 7. In this manner, the pixel circuit and the sensor circuit that are located in the third to eighth circuit rows CRW3, CRW4, CRW5, CRW6, CRW7, and CRW8 of FIG. 5, and the first to third pixel electrodes AE1, AE2, and AE3 and the sensor electrode PE that are located in the third to eighth pixel rows PRW3, PRW4, PRW5, PRW6, PRW7, and PRW8 of FIG. 7 may be electrically connected.

Figure 9:
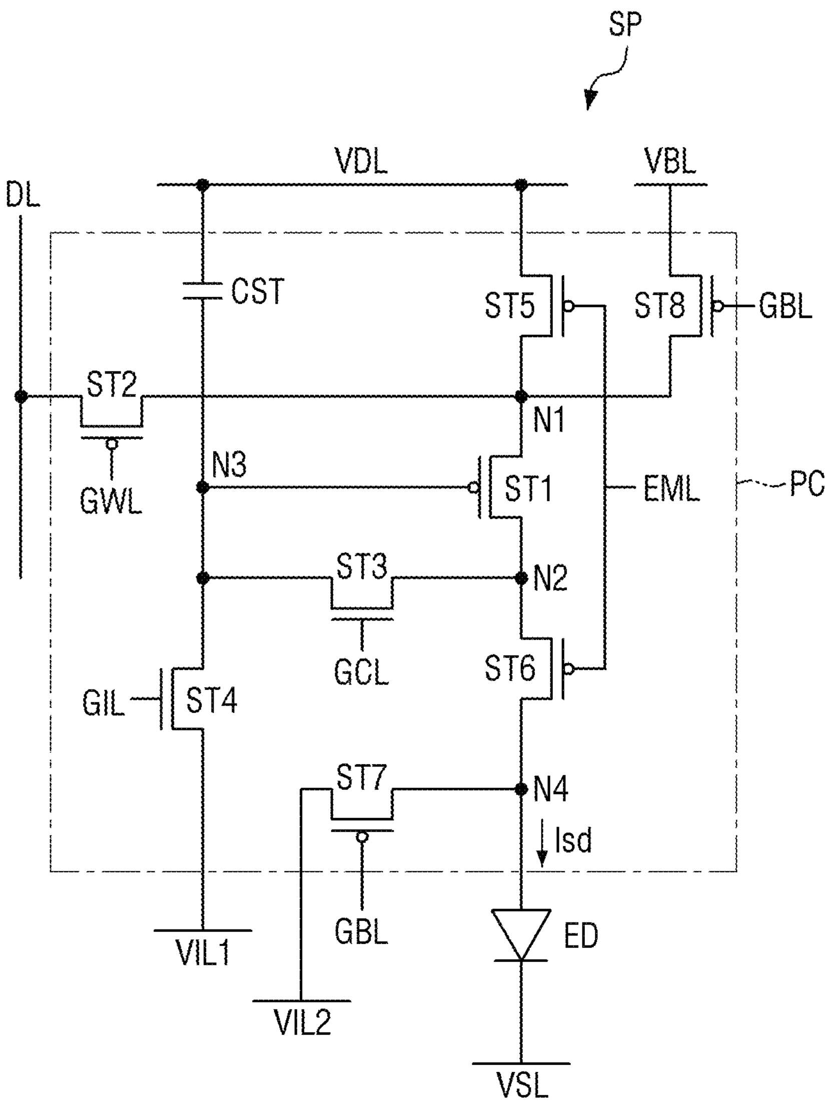
FIG. 9 is a circuit diagram illustrating a pixel of a display device according to one or more embodiments.

FIG. 9 is a circuit diagram illustrating a pixel of a display device according to one or more embodiments.

Referring to FIG. 9, the pixel SP may be connected to a first gate line GWL, a second gate line GCL, a third gate line GIL, a fourth gate line GBL, the emission control line EML, the data line DL, the driving voltage line VDL, a first initialization voltage line VIL1, a second initialization voltage line VIL2, and a low potential line VSL.

The pixel SP may include a light-emitting element ED and a pixel circuit PC for driving the light-emitting element ED. The pixel circuit PC may include the first to eighth transistors ST1, ST2, ST3, ST4, ST5, ST6, ST7, and ST8 and a storage capacitor CST.

The first transistor ST1 may control a driving current supplied to the light-emitting element ED. The first transistor ST1 may include a gate electrode, a first electrode, and a second electrode. The gate electrode of the first transistor ST1 may be connected to a third node N3, the first electrode thereof may be connected to a first node N1, and the second electrode thereof may be connected to a second node N2. For example, the first electrode of the first transistor ST1 may be a source electrode, and the second electrode thereof may be a drain electrode, but the present disclosure is not limited thereto.

The first transistor ST1 may control a source-drain current Isd (hereinafter, referred to as "driving current") according to the data voltage applied to the gate electrode. The driving current Isd flowing through the channel of the first transistor ST1 may be proportional to the square of a difference between a threshold voltage Vth and a voltage Vsg between the source electrode and the gate electrode of the first transistor ST1 (e.g., $Isd=k\times(Vsg-Vth)^2$). Here, k is a proportional coefficient determined by the structure and physical characteristics of the first transistor ST1, Vsg is a source-gate voltage of the first transistor ST1, and Vth is a threshold voltage of the first transistor ST1.

The light-emitting element ED may emit light by receiving the driving current Isd. The emission amount or the luminance of the light-emitting element ED may be proportional to the magnitude of the driving current Isd. The light-emitting element ED may include a first electrode, a second electrode, and a light-emitting layer located between the first electrode and the second electrode. The first electrode of the light-emitting element ED may be connected to a fourth node N4. The first electrode of the light-emitting element ED may be connected to the second electrode of the sixth transistor ST6 and the first electrode of the seventh transistor ST7 through the fourth node N4. The second electrode of the light-emitting element ED may be connected to the low potential line VSL. For example, the first electrode of the light-emitting element ED may be an anode electrode or a pixel electrode, and the second electrode thereof may be a cathode electrode or a common electrode, but the present disclosure is not limited thereto.

The second transistor ST2 may be turned on by the first gate signal of the first gate line GWL to electrically connect the data line DL to the first node N1 which is the first electrode of the first transistor ST1. The second transistor ST2 may be turned on based on the first gate signal to supply the data voltage to the first node N1. The gate electrode of the second transistor ST2 may be connected to the first gate line GWL, the first electrode thereof may be connected to the data line DL, and the second electrode thereof may be connected to the first node N1. The second electrode of the second transistor ST2 may be connected to the first electrode of the first transistor ST1, the second electrode of the fifth transistor ST5, and the second electrode of the eighth transistor ST8 through the first node N1. For example, the first electrode of the second transistor ST2 may be a source electrode and the second electrode thereof may be a drain electrode, but the present disclosure is not limited thereto.

The third transistor ST3 may be turned on by the second gate signal of the second gate line GCL to electrically connect the second node N2, which is the second electrode of the first transistor ST1, to the third node N3, which is the gate electrode the first transistor ST1. The gate electrode of the third transistor ST3 may be connected to the second gate line GCL, the first electrode thereof may be connected to the second node N2, and the second electrode thereof may be connected to the third node N3. The first electrode of the third transistor ST3 may be connected to the second electrode of the first transistor ST1 and the first electrode of the sixth transistor ST6 through the second node N2. The second electrode of the third transistor ST3 may be connected to the gate electrode of the first transistor ST1, the first electrode of the fourth transistor ST4, and a first capacitor electrode of the storage capacitor CST through the third node N3. For example, the first electrode of the third transistor ST3 may be a drain electrode and the second electrode thereof may be a source electrode, but is not limited thereto.

The fourth transistor ST4 may be turned on by a third gate signal of the third gate line GIL to electrically connect the third node N3, which is the gate electrode of the first transistor ST1, to the first initialization voltage line VIL1. The fourth transistor ST4 may be turned on based on the third gate signal, thereby discharging the gate electrode of the first transistor ST1 to a first initialization voltage. The gate electrode of the fourth transistor ST4 may be connected to the third gate line GIL, the first electrode thereof may be connected to the third node N3, and the second electrode thereof may be connected to the first initialization voltage line VIL1. The first electrode of the fourth transistor ST4 may be connected to the gate electrode of the first transistor ST1, the second electrode of the third transistor ST3, and the first capacitor electrode of the storage capacitor CST through the third node N3. For example, the first electrode of the fourth transistor ST4 may be a drain electrode and the second electrode thereof may be a source electrode, but is not limited thereto.

The fifth transistor ST5 may be turned on by an emission signal of the emission control line EML to electrically connect the driving voltage line VDL with the first node N1 that is the first electrode of the first transistor ST1. The gate electrode of the fifth transistor ST5 may be connected to the emission control line EML, the first electrode thereof may be connected to the driving voltage line VDL, and the second electrode thereof may be connected to the first node N1. The second electrode of the fifth transistor ST5 may be electrically connected to the first electrode of the first transistor ST1, the second electrode of the second transistor ST2, and the second electrode of the eighth transistor ST8 through the first node N1. For example, the first electrode of the fifth transistor ST5 may be a source electrode and the second electrode thereof may be a drain electrode, but the present disclosure is not limited thereto.

The sixth transistor ST6 may be turned on by the emission signal of the emission control line EML to electrically connect the second node N2 that is the second electrode of the first transistor ST1 with the fourth node N4 that is the first electrode of the light-emitting element ED. The gate electrode of the sixth transistor ST6 may be connected to the emission control line EML, the first electrode thereof may be connected to the second node N2, and the second electrode thereof may be connected to the fourth node N4. The first electrode of the sixth transistor ST6 may be connected to the second electrode of the first transistor ST1 and the first electrode of the third transistor ST3 through the second node N2. The second electrode of the sixth transistor ST6 may be connected to the first electrode of the light-emitting element ED and the first electrode of the seventh transistor ST7 through the fourth node N4. For example, the first electrode of the sixth transistor ST6 may be a source electrode and the second electrode thereof may be a drain electrode, but the present disclosure is not limited thereto.

When all of the fifth transistor ST5, the first transistor ST1, and the sixth transistor ST6 are turned on, the driving current Isd may be supplied to the plurality of light-emitting elements ED.

The seventh transistor ST7 may be turned on by the fourth gate signal of the fourth gate line GBL to electrically connect the second initialization voltage line VIL2 to the fourth node N4, which is the first electrode of the light-emitting element ED. By turning on the seventh transistor ST7 based on the fourth gate signal, the first electrode of the light-emitting element ED may be discharged to a second initialization voltage. The gate electrode of the seventh transistor ST7 may be connected to the fourth gate line GBL, the first electrode thereof may be connected to the fourth node N4, and the second electrode thereof may be connected to the second initialization voltage line VIL2. The first electrode of the seventh transistor ST7 may be connected to the first electrode of the light-emitting element ED and the second electrode of the sixth transistor ST6 through the fourth node N4.

The eighth transistor ST8 may be turned on by the fourth gate signal of the fourth gate line GBL to electrically connect the bias voltage line VBL with the first node N1 that is the source electrode of the first transistor ST1. The eighth transistor ST8 may be turned on based on the fourth gate signal to supply a bias voltage to the first node N1. The eighth transistor ST8 may improve hysteresis of the first transistor ST1 by supplying the bias voltage to the source electrode of the first transistor ST1. The gate electrode of the eighth transistor ST8 may be connected to the fourth gate line GBL, the first electrode thereof may be connected to the bias voltage line VBL, and the second electrode thereof may be connected to the first node N1. The second electrode of the eighth transistor ST8 may be electrically connected to the first electrode of the first transistor ST1, the second electrode of the second transistor ST2, and the second electrode of the fifth transistor ST5 through the first node N1. For example, the first electrode of the eighth transistor ST8 may be a source electrode and the second electrode thereof may be a drain electrode, but the present disclosure is not limited thereto.

Each of the first transistor ST1, the second transistor ST2, the fifth transistor ST5, the sixth transistor ST6, the seventh transistor ST7, and the eighth transistor ST8 may include a silicon-based semiconductor region. For example, each of the first transistor ST1, the second transistor ST2, the fifth transistor ST5, the sixth transistor ST6, the seventh transistor ST7, and the eighth transistor ST8 may include a semiconductor region made of low temperature polycrystalline silicon (LTPS). The semiconductor region made of low temperature polycrystalline silicon may have high electron mobility and excellent turn-on characteristics. Accordingly, because the display device includes the first transistor ST1, the second transistor ST2, the fifth transistor ST5, the sixth transistor ST6, the seventh transistor ST7, and the eighth transistor ST8 having excellent turn-on characteristics, a plurality of pixels SP can be driven stably and efficiently.

Each of the first, second, fifth, sixth, seventh, and eighth transistors ST1, ST2, ST5, ST6, ST7, and ST8 may correspond to a p-type transistor. For example, each of the first transistor ST1, the second transistor ST2, the fifth transistor ST5, the sixth transistor ST6, the seventh transistor ST7, and the eighth transistor ST8 may output a current flowing into the first electrode to the second electrode based on a gate low voltage applied to the gate electrode.

Each of the third transistor ST3 and the fourth transistor ST4 may include an oxide-based semiconductor region. For example, each of the third transistor ST3 and the fourth transistor ST4 may have a coplanar structure in which the gate electrode is located on the oxide-based semiconductor region. The transistor having the coplanar structure may have excellent leakage current characteristics, and may perform low frequency driving, thereby reducing power consumption. Accordingly, the display device may include the third transistor ST3 and the fourth transistor ST4 having excellent leakage current characteristics, thereby reducing or preventing a leakage current flowing in the pixel, and stably maintaining the voltage in the pixel.

Each of the third transistor ST3 and the fourth transistor ST4 may correspond to an n-type transistor. For example, each of the third transistor ST3 and the fourth transistor ST4 may output a current flowing into the first electrode to the second electrode based on a gate high voltage applied to the gate electrode.

The storage capacitor CST may be connected between the third node N3, which is the gate electrode of the first transistor ST1, and the driving voltage line VDL. For example, the first capacitor electrode of the storage capacitor CST may be connected to the third node N3, and the second capacitor electrode of the storage capacitor CST may be connected to the driving voltage line VDL, thereby maintaining a potential difference between the driving voltage line VDL and the gate electrode of the first transistor ST1.

Figure 10:
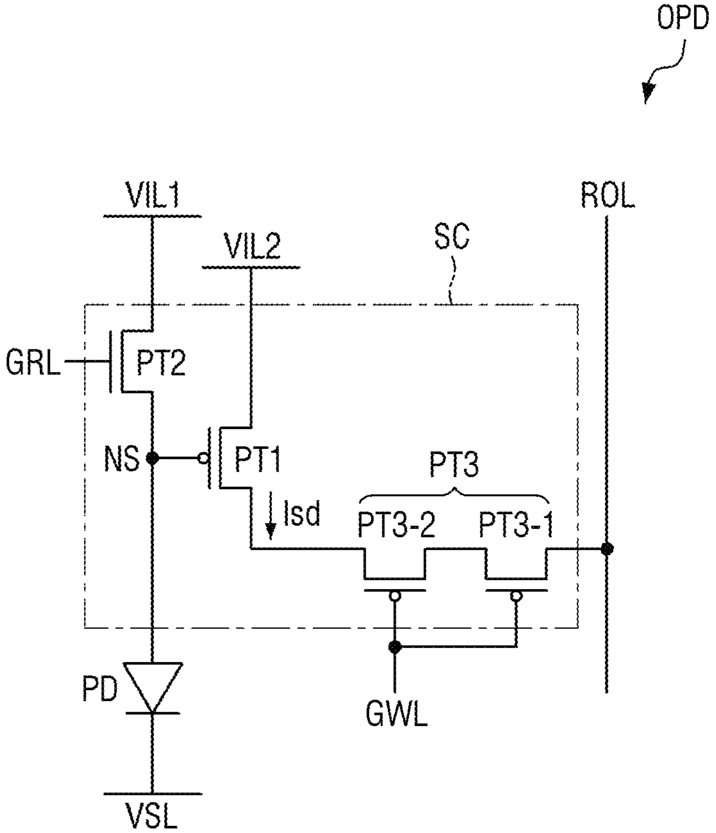
FIG. 10 is a circuit diagram of a fingerprint sensor of a display device according to one or more embodiments.

FIG. 10 is a circuit diagram of a fingerprint sensor of a display device according to one or more embodiments.

Referring to FIG. 10, the fingerprint sensor OPD may be connected to the first gate line GWL, the reset signal line GRL, the first initialization voltage line VIL1, the second initialization voltage line VIL2, and the read-out line ROL.

The fingerprint sensor OPD may include a light-receiving element PD and a sensor circuit SC for driving the light-receiving element PD. The sensor circuit SC may include the first to third sensor transistors PT1, PT2, and PT3.

The first sensor transistor PT1 may include a gate electrode, a first electrode, and a second electrode. The gate electrode of the first sensor transistor PT1 may be connected to a sensor node NS, the first electrode thereof may be connected to the third sensor transistor PT3, and the second electrode thereof may be connected to the second initialization voltage line VIL2. The first sensor transistor PT1 may control a source-drain current Isd (hereinafter referred to as "sensing current") based on the voltage of the sensor node NS, which is the first electrode of the light-receiving element PD. The sensing current Isd flowing through the channel of the first sensor transistor PT1 may be proportional to the square of a difference between a threshold voltage Vth and a voltage Vsg between the source electrode and the gate electrode of the first sensor transistor PT1 (e.g., Isd=k'×

$(Vsg-Vth)^2$). Here, k' is a proportional coefficient determined by the structure and physical characteristics of the first sensor transistor PT1, Vsg is a source-gate voltage of the first sensor transistor PT1, and Vth is a threshold voltage of the first sensor transistor PT1. The first electrode of the first sensor transistor PT1 may be a source electrode and the second electrode thereof may be a drain electrode, but the present disclosure is not limited thereto.

The second sensor transistor PT2 may be turned on by the reset signal of the reset signal line GRL, thereby discharging the sensor node NS to the first initialization voltage. The gate electrode of the second sensor transistor PT2 may be connected to the reset signal line GRL, the first electrode thereof may be connected to the sensor node NS, and the second electrode thereof may be connected to the first initialization voltage line VIL1. The first electrode of the second sensor transistor PT2 may be connected to the first electrode of the light-receiving element PD and the gate electrode of the first sensor transistor PT1 through the sensor node NS. The first electrode of the second sensor transistor PT2 may be a drain electrode and the second electrode thereof may be a source electrode, but is not limited thereto.

The third sensor transistor PT3 may be turned on by the first gate signal of the first gate line GWL to electrically connect the first electrode of the first sensor transistor PT1 to the read-out line ROL. The third sensor transistor PT3 may include the third-first sensor transistor PT3-1 and the third-second sensor transistor PT3-2 connected in series. The third-first sensor transistor PT3-1 and the third-second sensor transistor PT3-2 may be connected in series between the first electrode of the first sensor transistor PT1 and the read-out line ROL. The gate electrode of the third-first sensor transistor PT3-1 and the gate electrode of the third-second sensor transistor PT3-2 may be integrally formed and electrically connected to the first gate line GWL. The first electrode of the third-first sensor transistor PT3-1 may be connected to the read-out line ROL, and the second electrode of the third-second sensor transistor PT3-2 may be connected to the first electrode of the first sensor transistor PT1. The second electrode of the third-first sensor transistor PT3-1 and the first electrode of the third-second sensor transistor PT3-2 may be integrally formed. The first electrode of each of the third-first sensor transistor PT3-1 and the third-second sensor transistor PT3-2 may be a source electrode and the second electrode thereof may be a drain electrode, but the present disclosure is not limited thereto.

The light-receiving element PD may recognize the pattern of the user's fingerprint based on light reflected from the user's finger. The first electrode of the light-receiving element PD may be connected to the sensor node NS, which is the gate electrode of the first sensor transistor PT1, and the second electrode thereof may be connected to the low potential line VSL. The second electrode of the light-receiving element PD may receive the low potential voltage from the low potential line VSL. For example, the first electrode of the light-receiving element PD may be a sensor electrode, and the second electrode thereof may be a common electrode, but the present disclosure is not limited thereto.

When the user's finger touches the display panel 100, the light-receiving element PD may receive light reflected by the ridges or valleys of the finger. The light outputted from the light-emitting element ED may be reflected by the ridges or valleys of the finger, and the reflected light may reach the light-receiving element PD. The light-receiving element PD may convert the energy of light into an electrical signal (current or voltage) formed between the first and second electrodes, and the converted electrical signal may flow from the light-receiving element PD to the sensor node NS as a reverse bias current. For example, when the light-receiving element PD receives light and an electric field is formed between the first and second electrodes of the light-receiving element PD, a current may flow through the light-receiving element PD in proportion to the amount of light and the voltage at the sensor node NS may increase. Accordingly, when the light-receiving element PD receives light, the voltage of the sensor node NS may increase and the magnitude of a sensing current (or source-drain current) of the first sensor transistor PT1 may decrease. The sensing current of the first sensor transistor PT1 may be applied to the display driver 200 as a sensing signal through the third sensor transistor PT3 and the read-out line ROL.

Figure 11:
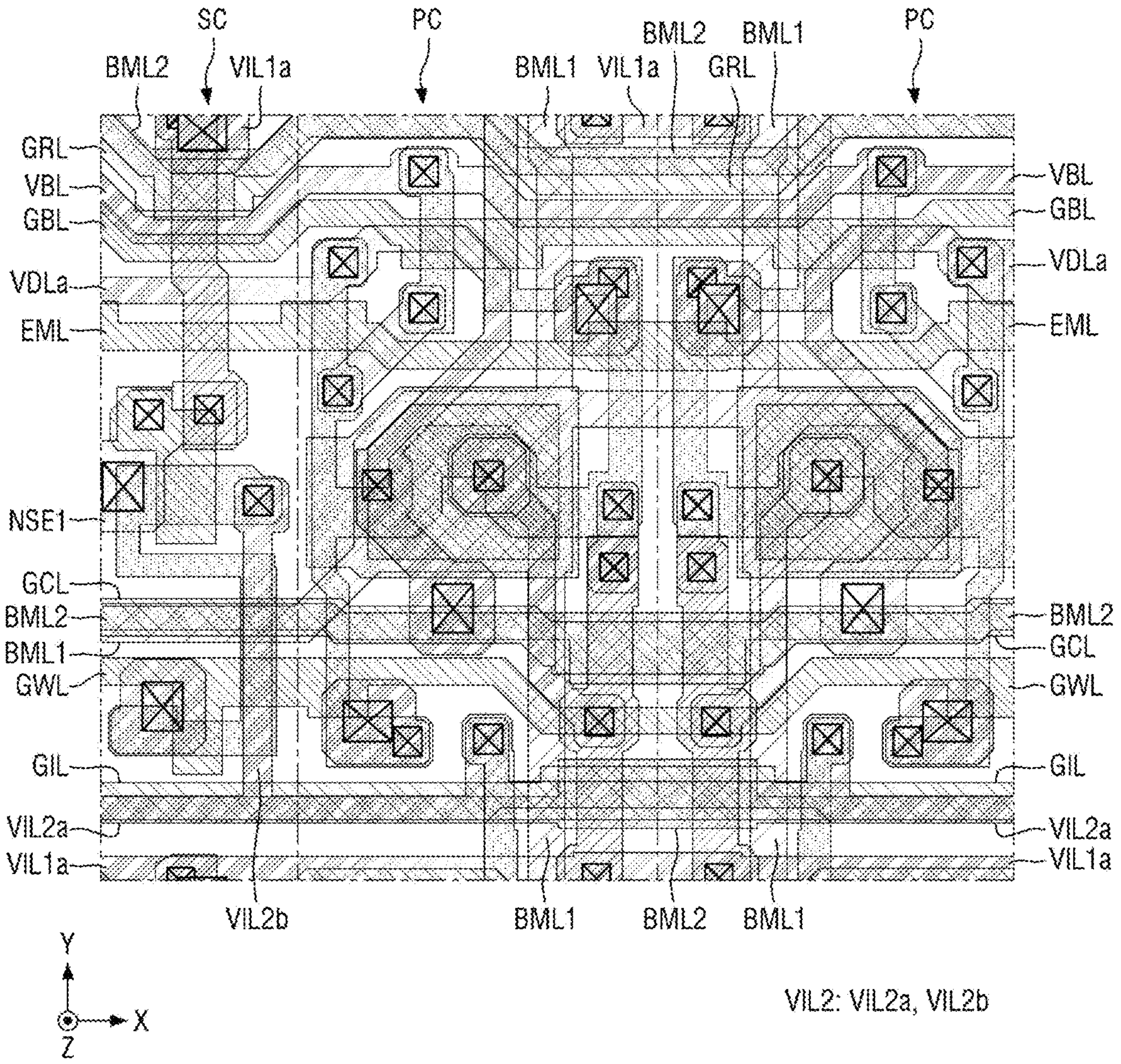
FIG. 11 is a layout diagram illustrating some layers of a pixel circuit and a sensor circuit of a display device according to one or more embodiments.
Figure 12:
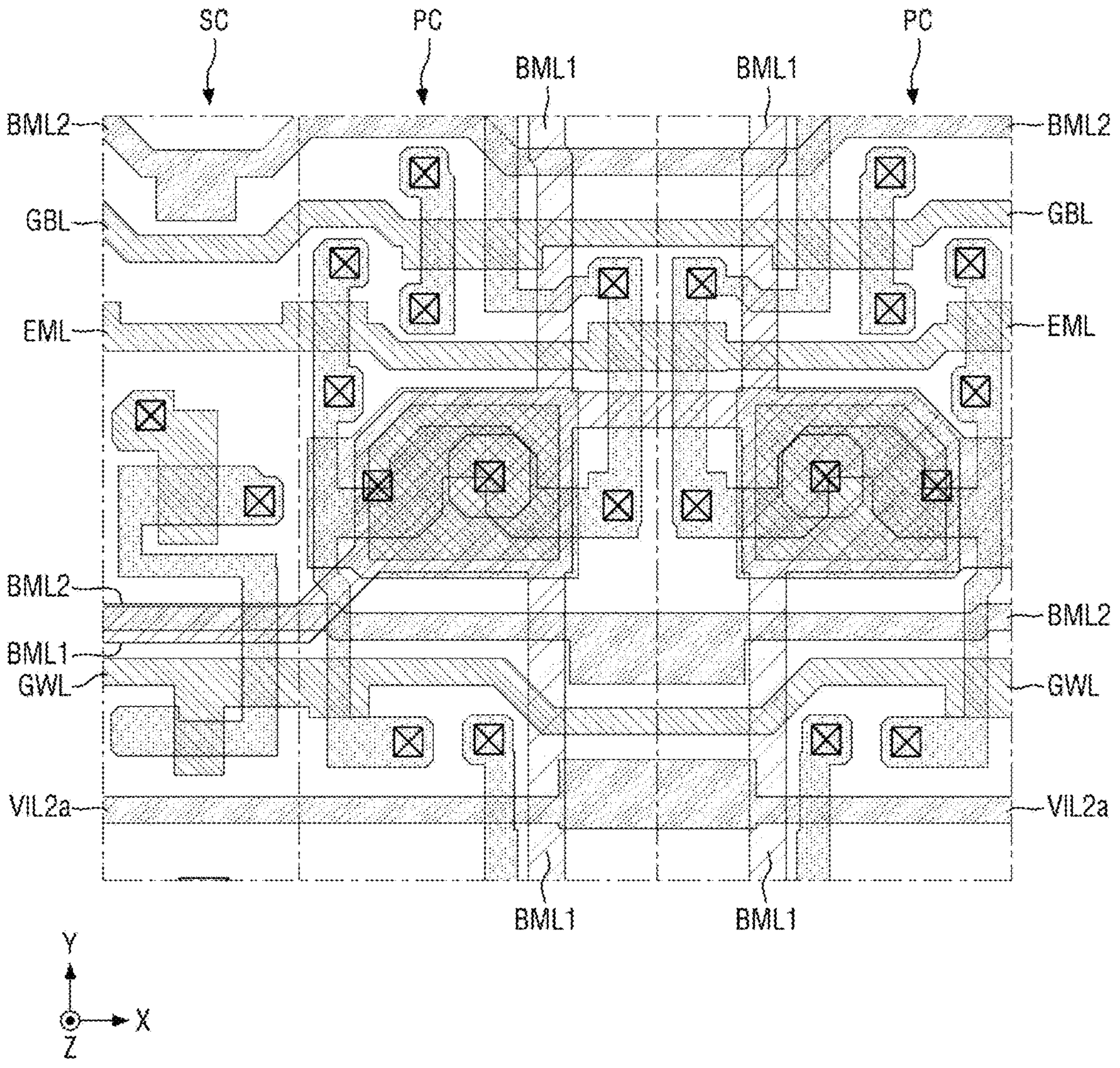
FIG. 12 is a layout diagram showing some layers of FIG. 11.
Figure 13:
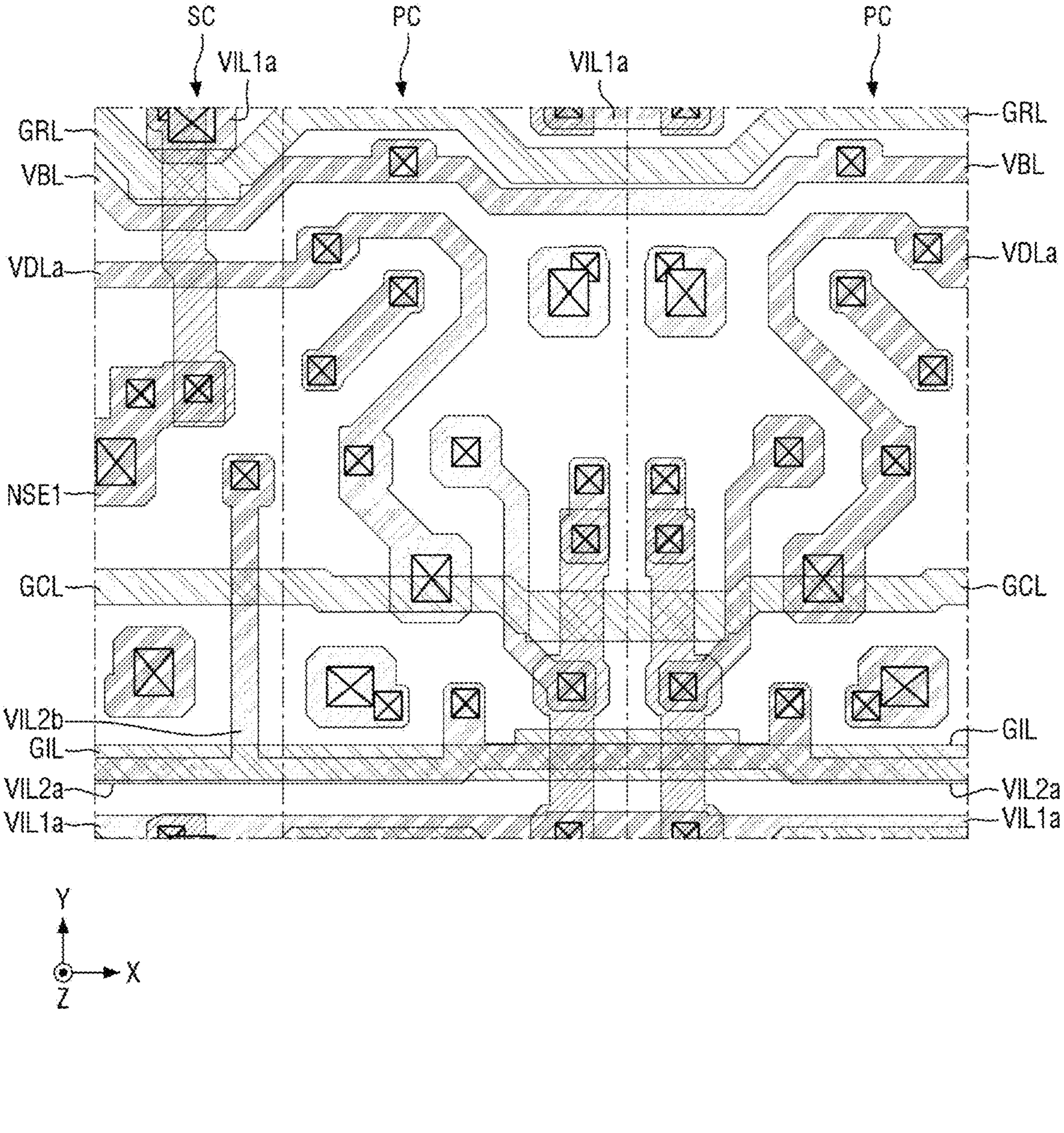
FIG. 13 is a layout diagram showing some other layers of FIG. 11.
Figure 14:
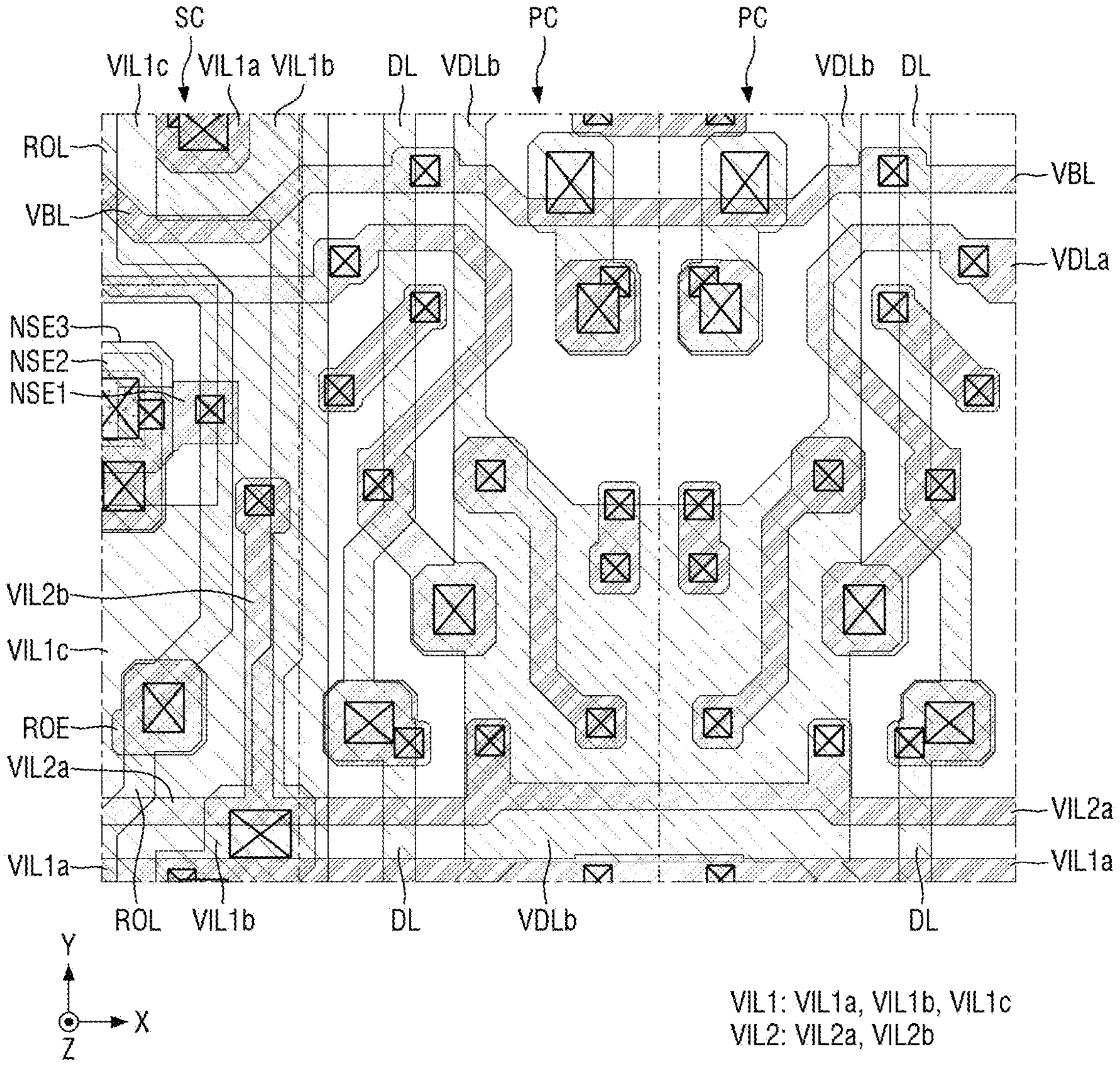
FIG. 14 is a layout diagram illustrating some other layers of the pixel circuit and the sensor circuit of the display device according to one or more embodiments.
Figure 15:
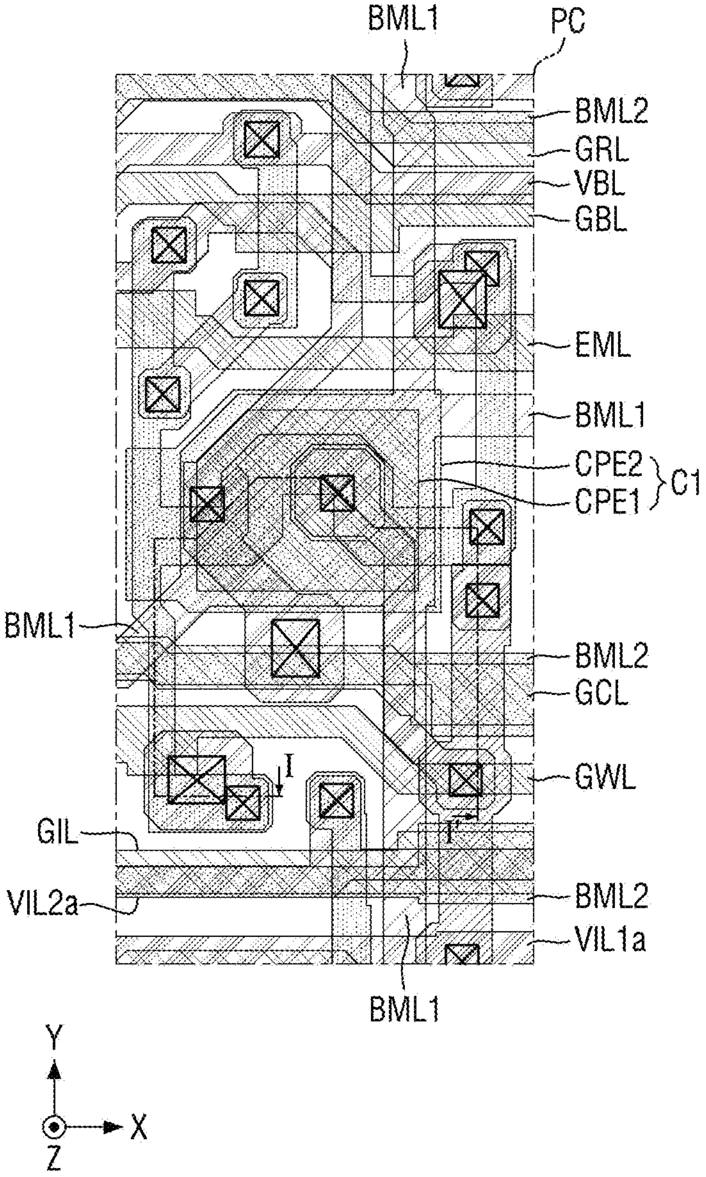
FIG. 15 is a layout diagram showing some layers of a pixel circuit of a display device according to one or more embodiments.
Figure 16:
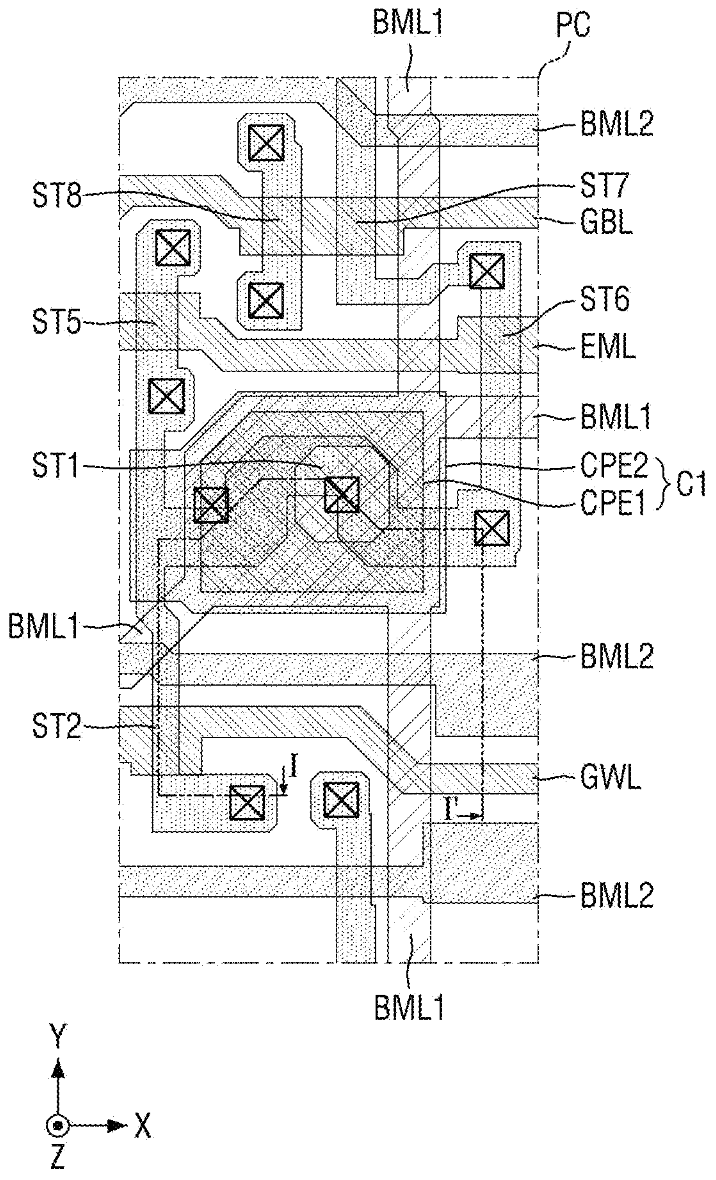
FIG. 16 is a layout diagram showing some layers of FIG. 15.
Figure 17:
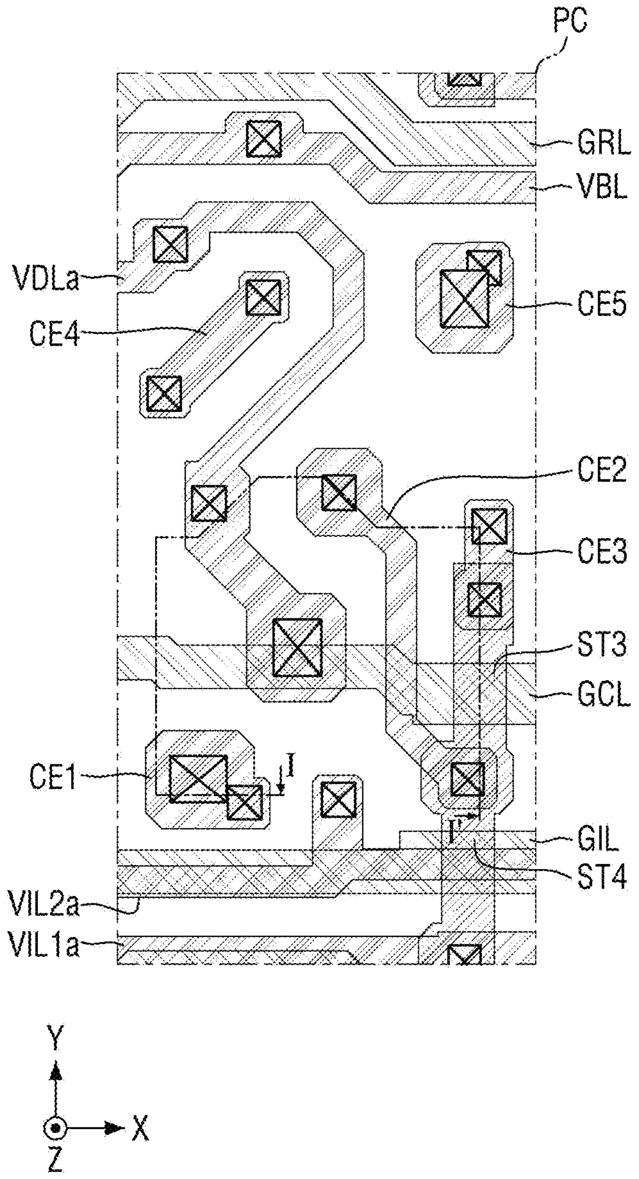
FIG. 17 is a layout diagram showing some other layers of FIG. 15.
Figure 18:
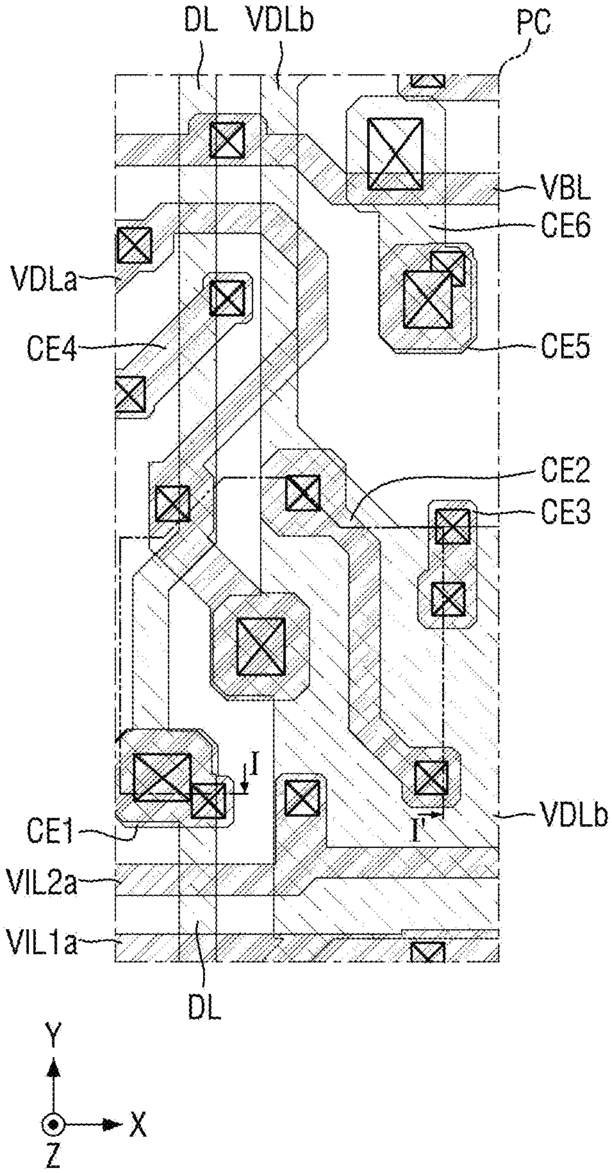
FIG. 18 is a layout diagram showing some other layers of the pixel circuit of the display device according to one or more embodiments.
Figure 19:
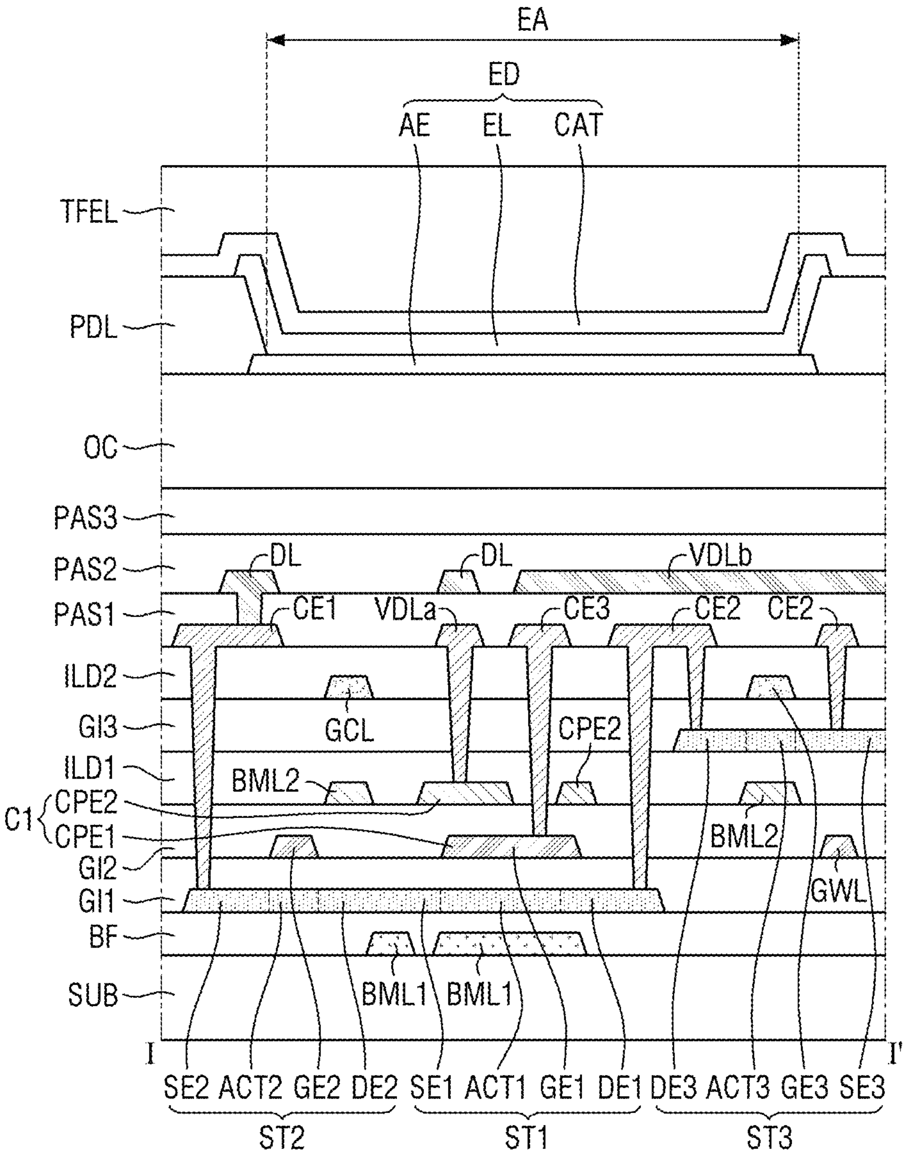
FIG. 19 is a cross-sectional view taken along the line I-I' of FIGS. 15 to 18.

FIG. 11 is a layout diagram illustrating some layers of a pixel circuit and a sensor circuit of a display device according to one or more embodiments. FIG. 11 may include a metal layer MTL, a first active layer ACTL1, a first gate layer GTL1, a second gate layer GTL2, a second active layer ACTL2, a third gate layer GTL3, and a first source metal layer SDL1 of the display device. FIG. 12 is a layout diagram showing some layers of FIG. 11. FIG. 12 may include the metal layer MTL, the first active layer ACTL1, the first gate layer GTL1, and the second gate layer GTL2 of the display device. FIG. 13 is a layout diagram showing some other layers of FIG. 11. FIG. 13 may include the second active layer ACTL2, the third gate layer GTL3, and the first source metal layer SDL1 of the display device. FIG. 14 is a layout diagram illustrating some other layers of the pixel circuit and the sensor circuit of the display device according to one or more embodiments. FIG. 14 may include the first source metal layer SDL1, the second source metal layer SDL2, and the third source metal layer SDL3 of the display device. FIG. 15 is a layout diagram showing some layers of a pixel circuit of a display device according to one or more embodiments, and FIG. 16 is a layout diagram showing some layers of FIG. 15. FIG. 17 is a layout diagram showing some other layers of FIG. 15, and FIG. 18 is a layout diagram showing some other layers of the pixel circuit of the display device according to one or more embodiments. FIGS. 15 to 18 disclose the pixel circuit PC of FIGS. 11 to 14. FIG. 19 is a cross-sectional view taken along the line I-I' of FIGS. 15 to 18.

Referring to FIGS. 11 to 19, the sensor circuit SC and the pixel circuit PC may be adjacent to each other in the X-axis direction. The sensor circuit SC may be connected to the first gate line GWL, the reset signal line GRL, the first initialization voltage line VIL1, the second initialization voltage line VIL2, and the read-out line ROL. The pixel circuit PC may be connected to the first gate line GWL, the second gate line GCL, the third gate line GIL, the fourth gate line GBL, the emission control line EML, the data line DL, the driving voltage line VDL, the first initialization voltage line VIL1, and the second initialization voltage line VIL2.

The pixel circuit PC may include the first to eighth transistors ST1, ST2, ST3, ST4, ST5, ST6, ST7, and ST8 and the storage capacitor CST.

The first transistor ST1 may include a semiconductor region ACT1, a gate electrode GE1, a first electrode SE1, and a second electrode DE1. The semiconductor region ACT1, the first electrode SE1, and the second electrode DE1 of the first transistor ST1 may be located in the first active layer ACTL1, and the gate electrode GE1 of the first transistor ST1 may be located in a first gate layer GTL1. The gate electrode GE1 of the first transistor ST1 may be a part of a first capacitor electrode CPE1 of the first gate layer GTL1, and may overlap the semiconductor region ACT1 of the first transistor ST1. For example, the semiconductor region ACT1 of the first transistor ST1 may include low temperature polycrystalline silicon (LTPS).

A first light-blocking layer BML1 may be located in the metal layer MTL, and may overlap the first transistor ST1. The first light-blocking layers BML1 of the plurality of pixels SP may be connected to each other, but the present disclosure is not limited thereto. The first light-blocking layer BML1 may block light incident from the lower part of the first transistor ST1.

The gate electrode GE1 of the first transistor ST1 may be electrically connected to the first electrode of the fourth transistor ST4 and to the second electrode SE3 of the third transistor ST3 that are located in the second active layer ACTL2 through a second connection electrode CE2 of the first source metal layer SDL1. The first electrode SE1 of the first transistor ST1 may be connected to the second electrode of the fifth transistor ST5 and the second electrode DE2 of the second transistor ST2 that are located in the first active layer ACTL1. The first electrode SE1 of the first transistor ST1 may be electrically connected to the second electrode of the eighth transistor ST8 located in the first active layer ACTL1 through a fourth connection electrode CE4 of the first source metal layer SDL1. The second electrode DE1 of the first transistor ST1 may be electrically connected to a first electrode DE3 of the third transistor ST3 located in the second active layer ACTL2 through a third connection electrode CE3 of the first source metal layer SDL1. The second electrode DE1 of the first transistor ST1 may be connected to the first electrode of the sixth transistor ST6 located in the first active layer ACTL1.

The second transistor ST2 may include a semiconductor region ACT2, a gate electrode GE2, a first electrode SE2, and a second electrode DE2. The semiconductor region ACT2, the first electrode SE2, and the second electrode DE2 of the second transistor ST2 may be located in the first active layer ACTL1, and the gate electrode GE2 of the second transistor ST2 may be located in the first gate layer GTL1. The gate electrode GE2 of the second transistor ST2 may be a part of the first gate line GWL of the first gate layer GTL1, and may overlap the semiconductor region ACT2 of the second transistor ST2. For example, the semiconductor region ACT2 of the second transistor ST2 may include low temperature polycrystalline silicon (LTPS).

The first electrode SE2 of the second transistor ST2 may be electrically connected to the data line DL of the second source metal layer SDL2 through a first connection electrode CE1 of the first source metal layer SDL1. The second electrode DE2 of the second transistor ST2 may be connected to the first electrode SE1 of the first transistor ST1 and to the second electrode of the fifth transistor ST5. The second electrode DE2 of the second transistor ST2 may be electrically connected to the second electrode of the eighth transistor ST8 through the fourth connection electrode CE4.

The third transistor ST3 may include a semiconductor region ACT3, a gate electrode GE3, the first electrode DE3, and the second electrode SE3. The semiconductor region ACT3, the first electrode DE3, and the second electrode SE3 of the third transistor ST3 may be located in the second active layer ACTL2, and the gate electrode GE3 of the third transistor ST3 may be located in the third gate layer GTL3. The gate electrode GE3 of the third transistor ST3 may be a part of the second gate line GCL of the third gate layer GTL3, and may overlap the semiconductor region ACT3 of the third transistor ST3. For example, the semiconductor region ACT3 of the third transistor ST3 may include oxide.

The second light-blocking layer BML2 may be located in the second gate layer GTL2, and may overlap the third transistor ST3 and the second gate line GCL. The second light-blocking layer BML2 may block light incident from the lower part of the third transistor ST3.

The first electrode DE3 of the third transistor ST3 may be electrically connected to the first electrode of the sixth transistor ST6 and the second electrode DE1 of the first transistor ST1 that are located in the first active layer ACTL1 through the third connection electrode CE3 of the first source metal layer SDL1. The second electrode SE3 of the third transistor ST3 may be connected to the first electrode of the fourth transistor ST4 located in the second active layer ACTL2. The second electrode SE3 of the third transistor ST3 may be electrically connected to the gate electrode GE1 of the first transistor ST1 and to the first capacitor electrode CPE1 that are located on the first gate layer GTL1 through the second connection electrode CE2 of the first source metal layer SDL1.

The fourth transistor ST4 may include a semiconductor region, a gate electrode, a first electrode, and a second electrode. The semiconductor region, the first electrode, and the second electrode of the fourth transistor ST4 may be located in the second active layer ACTL2, and the gate electrode of the fourth transistor ST4 may be located in the third gate layer GTL3. The gate electrode of the fourth transistor ST4 may be a part of the third gate line GIL of the third gate layer GTL3, and may overlap the semiconductor region of the fourth transistor ST4. For example, the semiconductor region of the fourth transistor ST4 may include oxide.

The second light-blocking layer BML2 may be located in the second gate layer GTL2, and may overlap the fourth transistor ST4 and the third gate line GIL. The second light-blocking layer BML2 may block light incident from the lower part of the fourth transistor ST4.

The first electrode of the fourth transistor ST4 may be electrically connected to the second electrode SE3 of the third transistor ST3, and may be electrically connected to the gate electrode GE1 of the first transistor ST1 through the second connection electrode CE2. The second electrode of the fourth transistor ST4 may be connected to a first portion VIL1*a* of the first initialization voltage line VIL1 of the first source metal layer SDL1.

The fifth transistor ST5 may include a semiconductor region, a gate electrode, a first electrode, and a second electrode. The semiconductor region, the first electrode, and the second electrode of the fifth transistor ST5 may be located in the first active layer ACTL1, and the gate electrode of the fifth transistor ST5 may be located in the first gate layer GTL1. The gate electrode of the fifth transistor ST5 may be a part of the emission control line EML of the first gate layer GTL1, and may overlap the semiconductor region of the fifth transistor ST5. For example, the semiconductor region of the fifth transistor ST5 may include low temperature polycrystalline silicon (LTPS).

The first electrode of the fifth transistor ST5 may be connected to a first portion VDLa of the driving voltage line VDL of the first source metal layer SDL1. The first portion VDLa of the driving voltage line VDL may be connected to a second portion VDLb of the driving voltage line VDL of the second source metal layer SDL2, and may supply a driving voltage to the first electrode of the fifth transistor ST5. The second electrode of the fifth transistor ST5 may be connected to the first electrode SE1 of the first transistor ST1 and the second electrode DE2 of the second transistor ST2. The second electrode of the fifth transistor ST5 may be electrically connected to the second electrode of the eighth transistor ST8 through the fourth connection electrode CE4.

The sixth transistor ST6 may include a semiconductor region, a gate electrode, a first electrode, and a second electrode. The semiconductor region, the first electrode, and the second electrode of the sixth transistor ST6 may be located in the first active layer ACTL1, and the gate electrode of the sixth transistor ST6 may be located in the first gate layer GTL1. The gate electrode of the sixth transistor ST6 may be a part of the emission control line EML, and may overlap the semiconductor region of the sixth transistor ST6. For example, the semiconductor region of the sixth transistor ST6 may include low temperature polycrystalline silicon (LTPS).

The first electrode of the sixth transistor ST6 may be connected to the second electrode DE1 of the first transistor ST1, and may be electrically connected to the first electrode DE3 of the third transistor ST3 through the third connection electrode CE3. The second electrode of the sixth transistor ST6 may be connected to the first electrode of the seventh transistor ST7 located in the first active layer ACTL1, and may be electrically connected to the first electrode of the light-emitting element ED through the fifth connection electrode CE5 of the first source metal layer SDL1 and the sixth connection electrode CE6 of the second source metal layer SDL2.

The seventh transistor ST7 may include a semiconductor region, a gate electrode, a first electrode, and a second electrode. The semiconductor region, the first electrode, and the second electrode of the seventh transistor ST7 may be located in the first active layer ACTL1, and the gate electrode of the seventh transistor ST7 may be located in the first gate layer GTL1. The gate electrode of the seventh transistor ST7 may be a part of the fourth gate line GBL of the first gate layer GTL1, and may overlap the semiconductor region of the seventh transistor ST7. For example, the semiconductor region of the seventh transistor ST7 may include low temperature polycrystalline silicon (LTPS).

The first electrode of the seventh transistor ST7 may be connected to the second electrode of the sixth transistor ST6, and may be electrically connected to the first electrode of the light-emitting element ED through the fifth and sixth connection electrodes CE5 and CE6. The second electrode of the seventh transistor ST7 may be connected to a first portion VIL2*a* of the second initialization voltage line VIL2 located in the first source metal layer SDL1.

The eighth transistor ST8 may include a semiconductor region, a gate electrode, a first electrode, and a second electrode. The semiconductor region, the first electrode, and the second electrode of the eighth transistor ST8 may be located in the first active layer ACTL1, and the gate electrode of the eighth transistor ST8 may be located in the first gate layer GTL1. The gate electrode of the eighth transistor ST8 may be a part of the fourth gate line GBL of the first gate layer GTL1 and may overlap the semiconductor region of the eighth transistor ST8. For example, the semiconductor region of the eighth transistor ST8 may include low temperature polycrystalline silicon (LTPS).

The first electrode of the eighth transistor ST8 may be connected to the bias voltage line VBL of the first source metal layer SDL1. The second electrode of the eighth transistor ST8 may be electrically connected to the first electrode SE1 of the first transistor ST1, to the second electrode DE2 of the second transistor ST2, and to the second electrode of the fifth transistor ST5 through the fourth connection electrode CE4.

The capacitor Cst may include a first capacitor electrode CPE1 and a second capacitor electrode CPE2. The first and second capacitor electrodes CPE1 and CPE2 may overlap each other. The first capacitor electrode CPE1 of the capacitor CST may be located in the first gate layer GTL1, and the second capacitor electrode CPE2 may be located in the second gate layer GTL2. The first capacitor electrode CPE1 of the capacitor CST may include the gate electrode GE1 of the first transistor ST1, and the second capacitor electrode CPE2 may be connected to the first portion VDLa of the driving voltage line VDL.

In FIG. 19, the display panel 100 may include the substrate SUB, the metal layer MTL, a buffer layer BF, the first active layer ACTL1, a first gate-insulating layer GI1, the first gate layer GTL1, a second gate-insulating layer GI2, the second gate layer GTL2, a first interlayer insulating layer ILD1, the second active layer ACTL2, a third gate-insulating layer GI3, the third gate layer GTL3, a second interlayer insulating layer ILD2, the first source metal layer SDL1, a first passivation layer PAS1, the second source metal layer SDL2, a second passivation layer PAS2, a third passivation layer PAS3, a planarization layer OC, a pixel-defining layer PDL, the light-emitting element ED, and the encapsulation layer TFEL.

The substrate SUB may be a base substrate or a base member. The substrate SUB may be a flexible substrate that can be bent, folded, or rolled. For example, the substrate SUB may include a polymer resin, such as polyimide (PI), but is not limited thereto. For another example, the substrate SUB may include a glass material or a metal material.

The metal layer MTL may be located on the substrate SUB. The metal layer MTL may include the first light-blocking layer BML1.

The buffer layer BF may be located on the metal layer MTL and the substrate SUB. For example, the buffer layer BF may include an inorganic layer capable of reducing or preventing permeation of air or moisture. For example, the buffer layer BF may include a plurality of inorganic layers laminated alternately.

The first active layer ACTL1 may be located on the buffer layer BF. The first active layer ACTL1 may include a silicon-based material. For example, the first active layer ACTL1 may be formed of low temperature polycrystalline silicon (LTPS). The first active layer ACTL1 may include the semiconductor region ACT1, the first electrode SE1, and the second electrode DE1 of the first transistor ST1, and the semiconductor region ACT2, the first electrode SE2, and the second electrode DE2 of the second transistor ST2.

The first gate-insulating layer GI1 may be located on the first active layer ACTL1. The first gate-insulating layer GI1 may insulate the first active layer ACTL1 from the first gate layer GTL1.

The first gate layer GTL1 may be located on the first gate-insulating layer GI1. The first gate layer GTL1 may include the gate electrode GE1 of the first transistor ST1, the gate electrode GE2 of the second transistor ST2, the first capacitor electrode CPE1, and the first gate line GWL. The gate electrode GE1 of the first transistor ST1 may be a part of the first capacitor electrode CPE1.

The second gate-insulating layer GI2 may be located on the first gate layer GTL1. The second gate-insulating layer GI2 may insulate the first gate layer GTL1 from the second gate layer GTL2.

The second gate layer GTL2 may be located on the second gate-insulating layer GI2. The second gate layer GTL2 may include the second capacitor electrode CPE2 and the second light-blocking layer BML2. The second capacitor electrode CPE2 may overlap the first capacitor electrode CPE1.

The first interlayer insulating layer ILD1 may be located on the second gate layer GTL2. The first interlayer insulating layer ILD1 may insulate the second gate layer GTL2 from the second active layer ACTL2.

The second active layer ACTL2 may be located on the first interlayer insulating layer ILD1. The second active layer ACTL2 may include an oxide-based material. The second active layer ACTL2 may include the semiconductor region ACT3, the first electrode DE3, and the second electrode SE3 of the third transistor ST3.

The third gate-insulating layer GI3 may be located on the second active layer ACTL2. The third gate-insulating layer GI3 may insulate the second active layer ACTL2 from the third gate layer GTL3.

The third gate layer GTL3 may be located on the third gate-insulating layer GI3. The third gate layer GTL3 may include the second gate line GCL and the gate electrode GE3 of the third transistor ST3.

The second interlayer insulating layer ILD2 may be located on the third gate layer GTL3. The second interlayer insulating layer ILD2 may insulate the third gate layer GTL3 from the first source metal layer SDL1.

The first source metal layer SDL1 may be located on the second interlayer insulating layer ILD2. The first source metal layer SDL1 may include the first to third connection electrodes CE1, CE2, and CE3 and the first portion VDLa of the driving voltage line VDL.

The first passivation layer PAS1 may be located on the first source metal layer SDL1. The first passivation layer PAS1 may insulate the first source metal layer SDL1 from the second source metal layer SDL2.

The second source metal layer SDL2 may be located on the first passivation layer PAS1. The second source metal layer SDL2 may include the second portion VDLb of the driving voltage line VDL and the data line DL.

The second passivation layer PAS2 may be located on the second source metal layer SDL2. The second passivation layer PAS2 may insulate the second source metal layer SDL2 from the third source metal layer.

The third passivation layer PAS3 may be located on the second passivation layer PAS2 and the third source metal layer. The planarization layer OC may be located on the third passivation layer PAS3. The planarization layer OC may planarize the top of the transistor layer TFTL. The planarization layer OC may contain an organic insulating material, such as polyimide (PI).

The pixel-defining layer PDL may be located on the planarization layer OC. The pixel-defining layer PDL may define a plurality of emission areas EA. The pixel-defining layer PDL may contain an organic insulating material, such as polyimide (PI).

The light-emitting element ED may include the pixel electrode AE, a light-emitting layer EL, and a common electrode CAT. The pixel electrode AE may be located on the planarization layer OC. The pixel electrode AE may overlap one of the plurality of emission areas EA defined by the pixel-defining layer PDL. The pixel electrode AE may receive a driving current from the pixel circuit of the pixel SP.

The light-emitting layer EL may be located on the pixel electrode AE. For example, the light-emitting layer EL may be an organic light-emitting layer made of an organic material, but is not limited thereto. In the case where the light-emitting layer EL is the organic light-emitting layer, when the pixel circuit of the pixel SP applies a voltage (e.g., predetermined voltage) to the pixel electrode AE, and the common electrode CAT receives the common voltage or a cathode voltage, holes and electrons may move to the organic light-emitting layer EL through a hole-transporting layer and an electron-transporting layer, respectively, and the holes and electrons may combine with each other in the organic light-emitting layer EL to emit light.

The common electrode CAT may be arranged on the light-emitting layer EL. For example, the common electrode CAT may be made in the form of an electrode common to all of the pixels SP, rather than being specific to each of the pixels SP. The common electrode CAT may be located on the light-emitting layer EL in a plurality of emission areas, and may be located on the pixel-defining layer PDL in an area except the emission areas.

The encapsulation layer TFEL may be located on the common electrode CAT to cover the plurality of light-emitting elements ED. The encapsulation layer TFEL may include at least one inorganic layer to reduce or prevent permeation of oxygen or moisture into the plurality of light-emitting elements ED. The encapsulation layer TFEL may include at least one organic layer to protect the plurality of light-emitting elements ED from foreign matters, such as dust.

Figure 20:
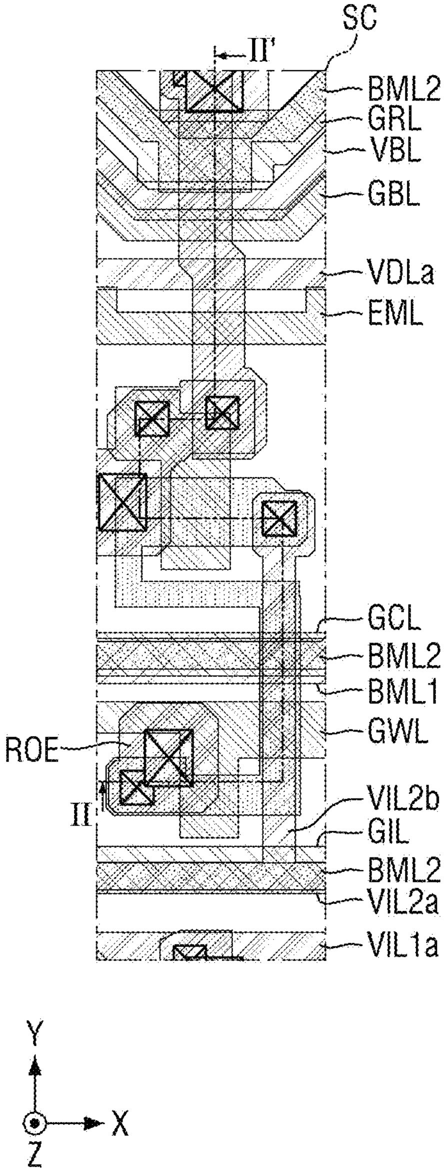
FIG. 20 is a layout diagram illustrating some layers of a sensor circuit of a display device according to one or more embodiments.
Figure 21:
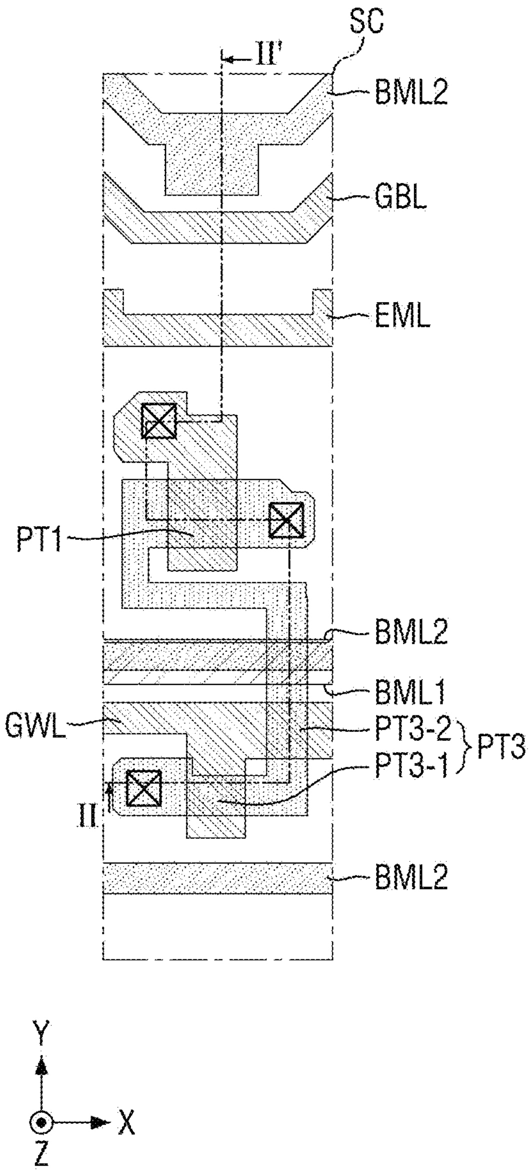
FIG. 21 is a layout diagram showing some layers of FIG. 20.
Figure 22:
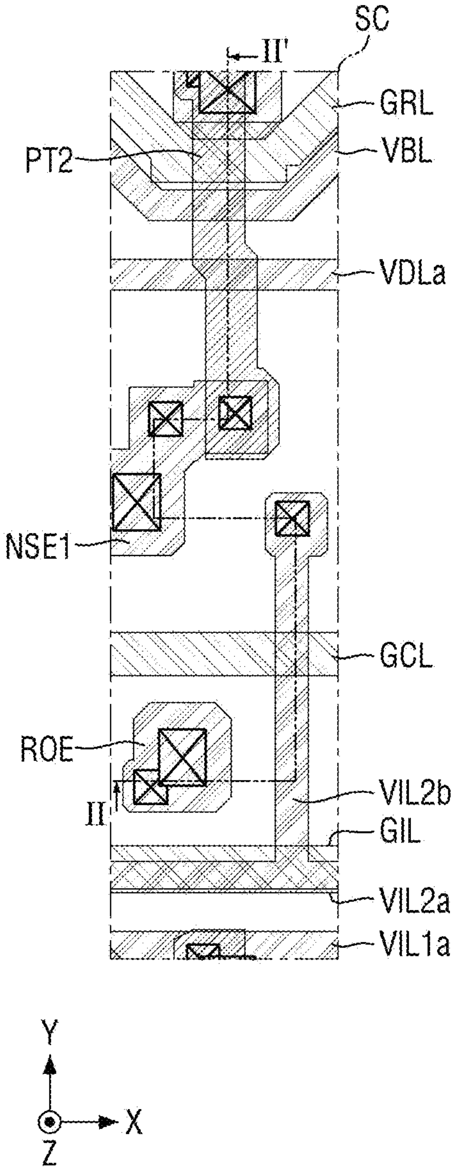
FIG. 22 is a layout diagram showing some other layers of FIG. 20.
Figure 23:
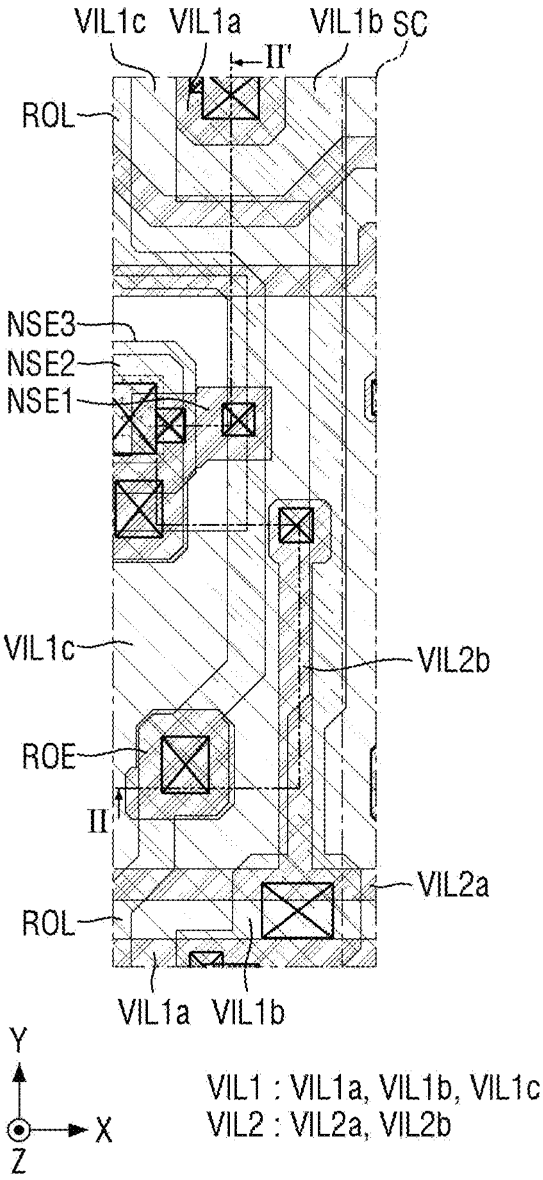
FIG. 23 is a layout diagram illustrating some other layers of the sensor circuit of the display device according to one or more embodiments.
Figure 24:
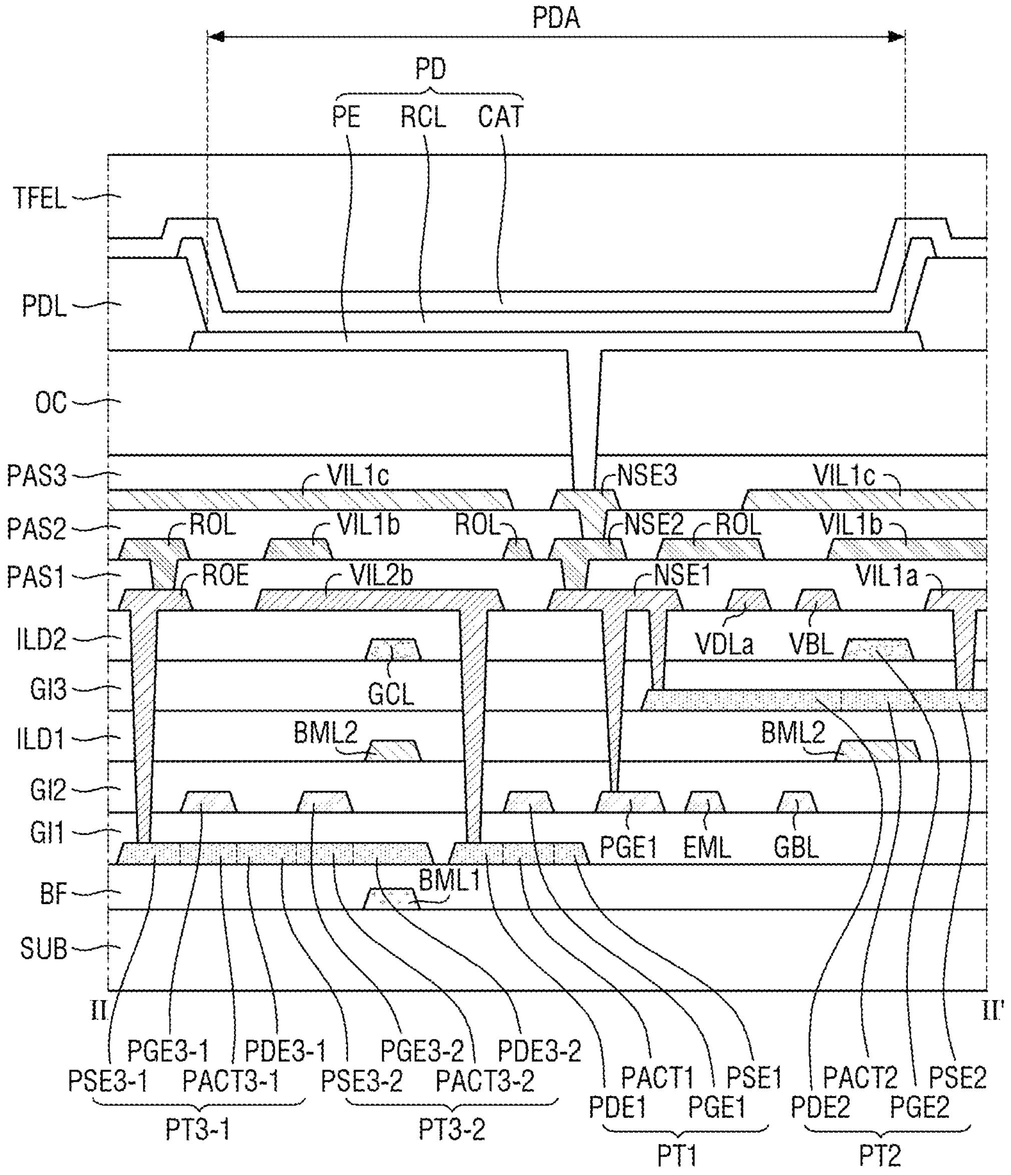
FIG. 24 is a cross-sectional view taken along the line II-II' of FIGS. 20 to 23.

FIG. 20 is a layout diagram illustrating some layers of a sensor circuit of a display device according to one or more embodiments. FIG. 20 may include the metal layer MTL, the first active layer ACTL1, the first gate layer GTL1, the second gate layer GTL2, the second active layer ACTL2, the third gate layer GTL3, and the first source metal layer SDL1 of the display device. FIG. 21 is a layout diagram showing some layers of FIG. 20. FIG. 21 may include the metal layer MTL, the first active layer ACTL1, the first gate layer GTL1, and the second gate layer GTL2 of the display device. FIG. 22 is a layout diagram showing some other layers of FIG. 20. FIG. 22 may include the second active layer ACTL2, the third gate layer GTL3, and the first source metal layer SDL1 of the display device. FIG. 23 is a layout diagram illustrating some other layers of the sensor circuit of the display device according to one or more embodiments. FIG. 23 may include the first source metal layer SDL1, the second source metal layer SDL2, and the third source metal layer SDL3 of the display device. FIGS. 20 to 23 disclose the sensor circuit SC of FIGS. 11 to 14. FIG. 24 is a cross-sectional view taken along the line II-II' of FIGS. 20 to 23.

Referring to FIGS. 20 to 24, the fingerprint sensor OPD may be connected to the first gate line GWL, the reset signal line GRL, the first initialization voltage line VIL1, the second initialization voltage line VIL2, and the read-out line ROL.

The first gate line GWL may be located in the first gate layer GTL1, and may extend in the X-axis direction. The first gate line GWL may supply a first gate signal to the third sensor transistor PT3.

The reset signal line GRL may be located in the third gate layer GTL3, and may extend in the X-axis direction. The reset signal line GRL may supply a reset signal to a gate electrode PGE2 of the second sensor transistor PT2.

The first initialization voltage line VIL1 may supply a first initialization voltage to the second electrode PSE2 of the second sensor transistor PT2. The first initialization voltage line VIL1 may include the first portion VIL1*a*, the second portion VIL1*b*, and a third portion VIL1*c*.

The first portion VIL1*a* of the first initialization voltage line VIL1 may be located in the first source metal layer SDL1, and may extend in the X-axis direction.

The first portion VIL1*a* of the first initialization voltage line VIL1 may be connected to the second electrode PSE2 of the second sensor transistor PT2 located in the second active layer ACTL2.

The second portion VIL1*b* of the first initialization voltage line VIL1 may be located in the second source metal layer SDL2, and may extend in the Y-axis direction. The second portion VIL1*b* of the first initialization voltage line VIL1 may be connected between the first portion VIL1*a* and the third portion VIL1*c* of the first initialization voltage line VIL1.

The third portion VIL1*c* of the first initialization voltage line VIL1 may be located in the third source metal layer SDL3, and may be connected to the second portion VIL1*b* of the first initialization voltage line VIL1. The third portion VIL1*c* of the first initialization voltage line VIL1 may overlap the second portion VIL1*b* and the read-out line ROL. The third portion VIL1*c* of the first initialization voltage line VIL1 may shield the upper part of the read-out line ROL.

The second initialization voltage line VIL2 may supply a second initialization voltage to the second electrode PDE1 of the first sensor transistor PT1. The second initialization voltage line VIL2 may include the first portion VIL2*a* and a second portion VIL2*b*.

The first portion VIL2*a* of the second initialization voltage line VIL2 may be located in the first source metal layer SDL1, and may extend in the X-axis direction. The second portion VIL2*b* of the second initialization voltage line VIL2 may extend from the first portion VIL2*a* in the Y-axis direction. The second portion VIL2*b* of the second initialization voltage line VIL2 may be connected to the second electrode PDE1 of the first sensor transistor PT1 located in the first active layer ACTL1.

The fingerprint sensor OPD may include the first to third sensor transistors PT1, PT2, and PT3 and the light-receiving element PD.

The first sensor transistor PT1 may include a semiconductor region PACT1, a gate electrode PGE1, a first electrode PSE1, and a second electrode PDE1. The semiconductor region PACT1, the first electrode PSE1, and the second electrode PDE1 of the first sensor transistor PT1 may be located in the first active layer ACTL1, and the gate electrode PGE1 of the first sensor transistor PT1 may be located in the first gate layer GTL1. The gate electrode PGE1 of the first sensor transistor PT1 may overlap the semiconductor region PACT1 of the first sensor transistor PT1. The semiconductor region PACT1 of the first sensor transistor PT1 may include a silicon-based material. For example, the semiconductor region PACT1 of the first sensor transistor PT1 may include low temperature polycrystalline silicon (LTPS).

The gate electrode PGE1 of the first sensor transistor PT1 may be electrically connected to the sensor electrode PE of the light-receiving element PD through first to third sensor node electrodes NSE1, NSE2, and NSE3. The first sensor node electrode NSE1 may be located in the first source metal layer SDL1, and may be connected to the gate electrode PGE1 of the first sensor transistor PT1. The second sensor node electrode NSE2 may be located in the second source metal layer SDL2, and may be connected to the first sensor node electrode NSE1. The third sensor node electrode NSE3 may be located in the third source metal layer SDL3 and electrically connect the second sensor node electrode NSE2 and the sensor electrode PE. The first to third sensor node electrodes NSE1, NSE2, and NSE3 may correspond to the sensor node NS of FIG. 10, and may be electrically connected to the sensor electrode PE of the light-receiving element PD. The gate electrode PGE1 of the first sensor transistor PT1 may be electrically connected to the first electrode PDE2 of the second sensor transistor PT2 located in the second active layer ACTL2 through the first sensor node electrode NSE1.

The first electrode PSE1 of the first sensor transistor PT1 may be electrically connected to the read-out line ROL through the third sensor transistor PT3. The first electrode PSE1 of the first sensor transistor PT1 may be connected to a second electrode PDE3-2 of the third-second sensor transistor PT3-2. The second electrode PDE1 of the first sensor transistor PT1 may be connected to the second portion VIL2*b* of the second initialization voltage line VIL2.

The second sensor transistor PT2 may include a semiconductor region PACT2, a gate electrode PGE2, a first electrode PDE2, and a second electrode PSE2. The semiconductor region PACT2, the first electrode PDE2, and the second electrode PSE2 of the second sensor transistor PT2 may be located in the second active layer ACTL2, and the gate electrode PGE2 of the second sensor transistor PT2 may be located in the third gate layer GTL3. The gate electrode PGE2 of the second sensor transistor PT2 may receive a reset signal from the reset signal line GRL of the third gate layer GTL3, and may overlap the semiconductor region PACT2 of the second sensor transistor PT2. For example, the semiconductor region PACT2 of the second sensor transistor PT2 may include an oxide-based material.

The second light-blocking layer BML2 may be located in the second gate layer GTL2, and may overlap the second sensor transistor PT2 and the reset signal line GRL. The second light-blocking layer BML2 may block light incident from the lower part of the second sensor transistor PT2.

The first electrode PDE2 of the second sensor transistor PT2 may be electrically connected to the gate electrode PGE1 of the first sensor transistor PT1 through the first sensor node electrode NSE1. The first electrode PDE2 of the second sensor transistor PT2 may be electrically connected to the sensor electrode PE of the light-receiving element PD through the first to third sensor node electrodes NSE1, NSE2, and NSE3. The second electrode PSE2 of the second sensor transistor PT2 may be connected to the first portion VIL1*a* of the first initialization voltage line VIL1.

The third sensor transistor PT3 may include the third-first sensor transistor PT3-1 and the third-second sensor transistor PT3-2 connected in series. The third-first sensor transistor PT3-1 may include a semiconductor region PACT3-1, a gate electrode PGE3-1, a first electrode PSE3-1, and a second electrode PDE3-1. The semiconductor region PACT3-1, the first electrode PSE3-1, and the second electrode PDE3-1 of the third-first sensor transistor PT3-1 may be located in the first active layer ACTL1, and the gate electrode PGE3-1 thereof may be located in the first gate layer GTL1. The gate electrode PGE3-1 of the third-first sensor transistor PT3-1 may overlap the semiconductor region PACT3-1 of the third-first sensor transistor PT3-1. The semiconductor region PACT3-1 of the third-first sensor transistor PT3-1 may include low temperature polycrystalline silicon (LTPS). The gate electrode PGE3-1 of the third-first sensor transistor PT3-1 may be a part of an extension portion extending from the first gate line GWL in a direction opposite to the Y-axis.

The first electrode PSE3-1 of the third-first sensor transistor PT3-1 may be electrically connected to the read-out line ROL of the second source metal layer SDL2 through a read-out electrode ROE of the first source metal layer SDL1. The read-out line ROL may extend in the Y-axis direction, and may supply a sensing signal to the display driver 200. The second electrode PDE3-1 of the third-first sensor transistor PT3-1 may be connected to a first electrode PSE3-2 of the third-second sensor transistor PT3-2.

The third-second sensor transistor PT3-2 may include a semiconductor region PACT3-2, a gate electrode PGE3-2, the first electrode PSE3-2, and the second electrode PDE3-2. The semiconductor region PACT3-2, the first electrode PSE3-2, and the second electrode PDE3-2 of the third-second sensor transistor PT3-2 may be located in the first active layer ACTL1, and the gate electrode PGE3-2 thereof may be located in the first gate layer GTL1. The gate electrode PGE3-2 of the third-second sensor transistor PT3-2 may overlap the semiconductor region PACT3-2 of the third-second sensor transistor PT3-2. The semiconductor region PACT3-2 of the third-second sensor transistor PT3-2 may include low temperature polycrystalline silicon (LTPS). The gate electrode PGE3-2 of the third-second sensor transistor PT3-2 may be a part of the first gate line GWL. The second electrode PDE3-2 of the third-second sensor transistor PT3-2 may be connected to the first electrode PSE1 of the first sensor transistor PT1.

In FIG. 24, the display panel 100 may include the substrate SUB, the metal layer MTL, the buffer layer BF, the first active layer ACTL1, the first gate-insulating layer GI1, the first gate layer GTL1, the second gate-insulating layer GI2, the second gate layer GTL2, the first interlayer insulating layer ILD1, the second active layer ACTL2, the third gate-insulating layer GI3, the third gate layer GTL3, the second interlayer insulating layer ILD2, the first source metal layer SDL1, the first passivation layer PAS1, the second source metal layer SDL2, the second passivation layer PAS2, the third source metal layer SDL3, the third passivation layer PAS3, the planarization layer OC, the pixel-defining layer PDL, the light-receiving element PD, and the encapsulation layer TFEL.

The pixel-defining layer PDL may be located on the planarization layer OC. The pixel-defining layer PDL may define the sensor area PDA. The pixel-defining layer PDL may contain an organic insulating material, such as polyimide (PI).

The light-receiving element PD may be located on the planarization layer OC. The light-receiving element PD of each of the plurality of fingerprint sensors OPD may include the sensor electrode PE, a light-receiving layer RCL, and the common electrode CAT. The sensor electrode PE may be located on the planarization layer OC, and may be located in the same layer as the pixel electrode AE of the pixel SP. The sensor electrode PE may overlap one of the plurality of sensor areas PDA defined by the pixel-defining layer PDL.

The light-receiving layer RCL may be located on the sensor electrode PE. When the user's finger touches the display panel 100, the light-receiving layer RCL may receive light reflected by the ridges or valleys of the finger. Light outputted from the light-emitting element ED may be reflected by the ridges or valleys of the finger, and the reflected light may reach the light-receiving layer RCL. The light-receiving element PD may convert the energy of light into an electrical signal (current or voltage) formed between the sensor electrode PE and the common electrode CAT, and the converted electrical signal may flow from the light-receiving element PD to the sensor node NS as a reverse bias current. For example, when the light-receiving element PD receives light, and an electric field is formed between the common electrode CAT and the sensor electrode PE of the light-receiving element PD, a current may flow through the light-receiving element PD in proportion to the amount of light and the voltage at the sensor node NS may increase. Accordingly, when the light-receiving element PD receives light, the voltage of the sensor node NS may increase, and the magnitude of a sensing current (or source-drain current) of the first sensor transistor PT1 may decrease. The sensing current of the first sensor transistor PT1 may be applied to the display driver 200 as a sensing signal through the third sensor transistor PT3 and the read-out line ROL.

The common electrode CAT may be located on the light-receiving layer RCL. For example, the common electrode CAT may be implemented in the form of an electrode that is common to all fingerprint sensors OPD, rather than being specific to each of the fingerprint sensors OPD. The common electrode CAT may be located on the light-receiving layer RCL in the plurality of sensor areas PDA, and may be located on the pixel-defining layer PDL in areas other than the plurality of sensor areas PDA.

Figure 25:
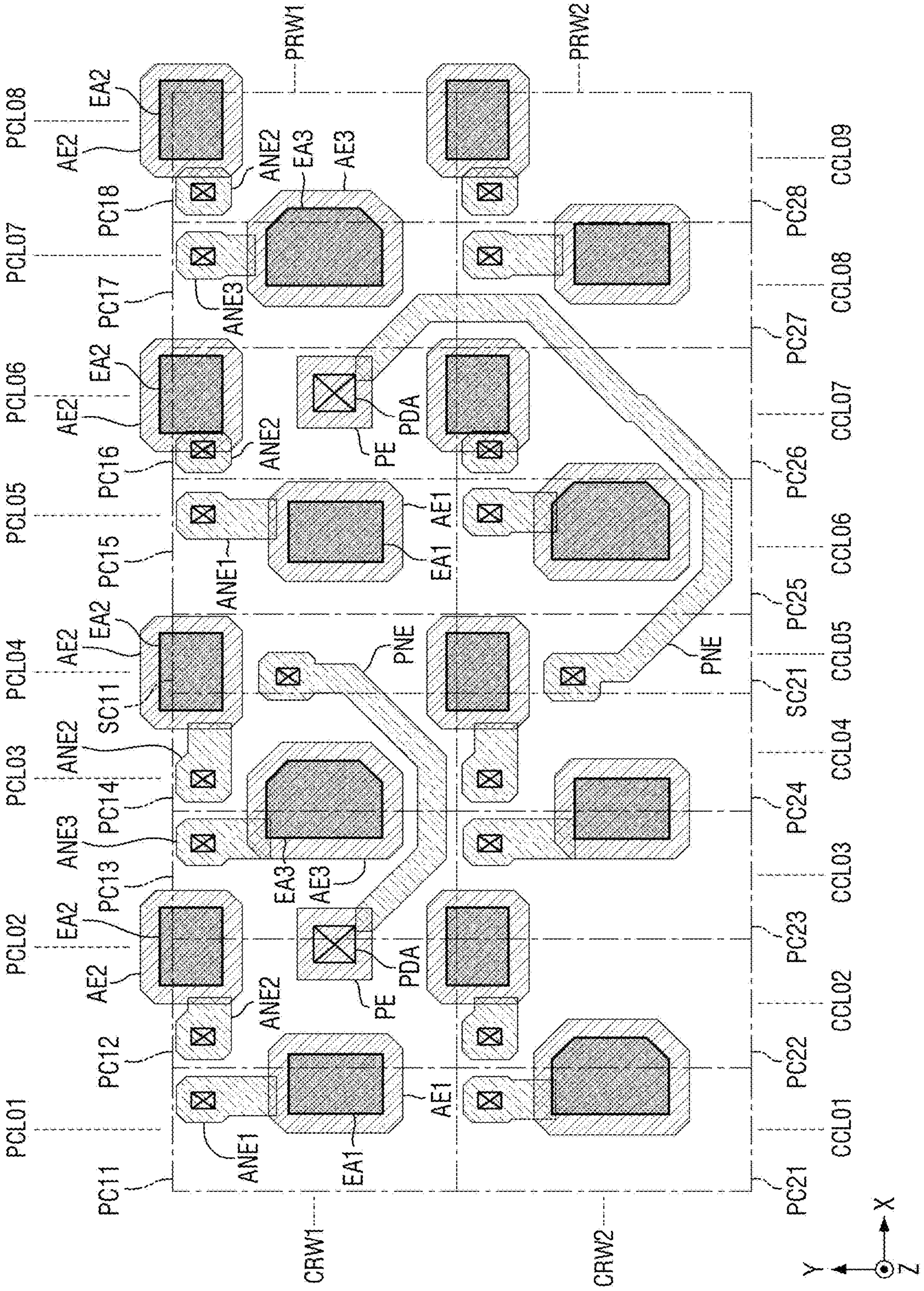
FIG. 25 is a plan view showing a pixel circuit, a sensor circuit, a pixel electrode, an anode connection electrode, a sensor electrode, and a sensor connection electrode of a display device according to one or more other embodiments.
Figure 26:
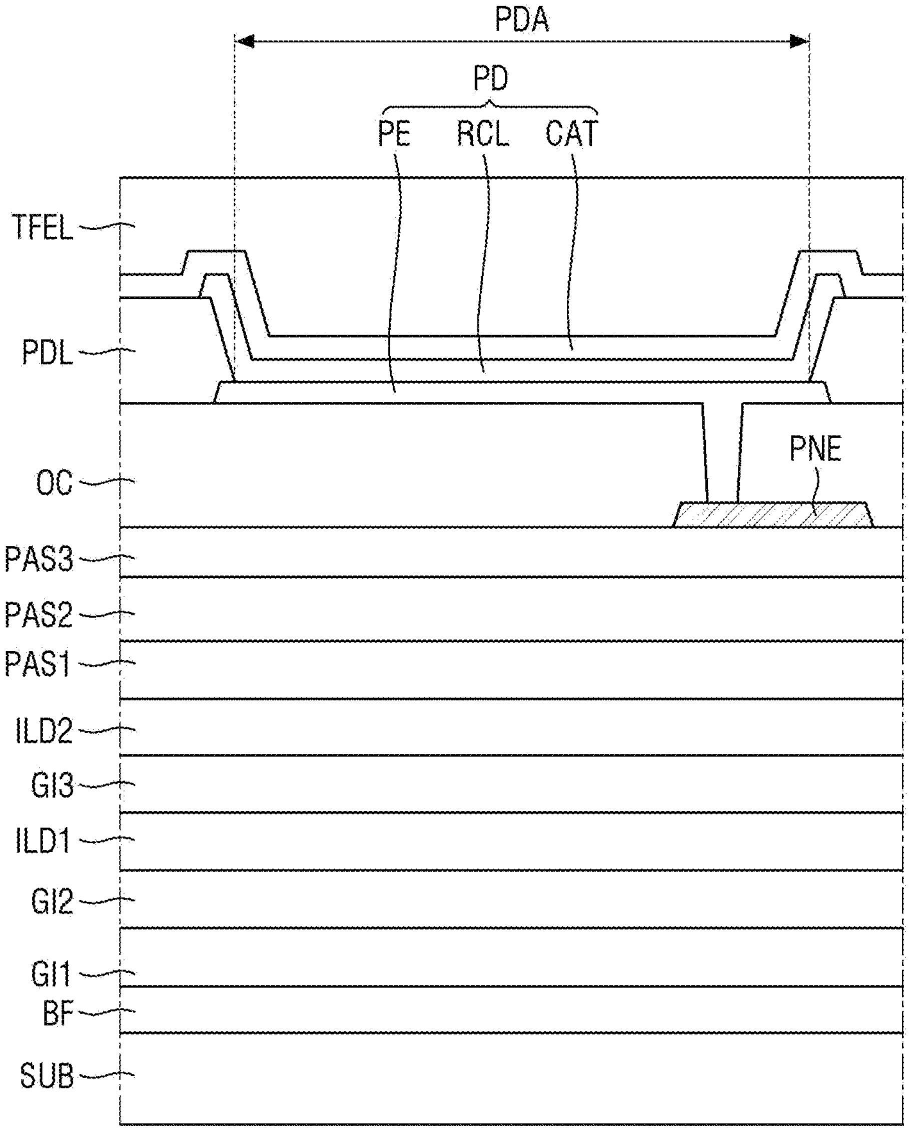
FIG. 26 is a cross-sectional view showing the sensor electrode and the sensor connection electrode of FIG. 25.

FIG. 25 is a plan view showing a pixel circuit, a sensor circuit, a pixel electrode, an anode connection electrode, a sensor electrode, and a sensor connection electrode of a display device according to one or more other embodiments, and FIG. 26 is a cross-sectional view showing the sensor electrode and the sensor connection electrode of FIG. 25. The display device of FIGS. 25 and 26 is different from the display device of FIG. 8 in the configurations of the anode connection electrode and the sensor connection electrode, so that the same configuration as that described above will be briefly described or omitted.

Referring to FIGS. 25 and 26, four unit pixels UP may correspond to the eleventh to eighteenth pixel circuits PC11, PC12, PC13, PC14, PC15, PC16, PC17, and PC18 and the twenty-first to twenty-eighth pixel circuits PC21, PC22, PC23, PC24, PC25, PC26, PC27, and PC28. Two fingerprint sensors OPD may correspond to the eleventh and twenty-first sensor circuits SC11 and SC21.

The eleventh pixel circuit PC11 may be electrically connected to the first pixel electrode AE1 located in the first pixel row PRW1 and the first pixel column PCL01 through the first anode connection electrode ANE1. The first anode connection electrode ANE1 may be located in an auxiliary metal layer between the first pixel electrode AE1 and the eleventh pixel circuit PC11. The auxiliary metal layer may be located on the third passivation layer PAS3. The auxiliary metal layer may include a transparent conductive material, and may transmit light. For example, the auxiliary metal layer may include an electrode or a line located at a transmitting portion of the display panel 100 that overlaps a camera or a sensor.

The twelfth pixel circuit PC12 may be electrically connected to the second pixel electrode AE2 located in the first pixel row PRW1 and the second pixel column PCL02 through the second anode connection electrode ANE2. The second anode connection electrode ANE2 may be located in an auxiliary metal layer between the second pixel electrode AE2 and the twelfth pixel circuit PC12.

The thirteenth pixel circuit PC13 may be electrically connected to the third pixel electrode AE3 located in the first pixel row PRW1 and the third pixel column PCL03 through the third anode connection electrode ANE3. The third anode connection electrode ANE3 may be located in an auxiliary metal layer between the third pixel electrode AE3 and the thirteenth pixel circuit PC13.

The eleventh sensor circuit SC11 may be electrically connected to a sensor electrode PE located in the first pixel row PRW1 and the second pixel column PCL02 through a sensor connection electrode PNE. The sensor connection electrode PNE may be located on an auxiliary metal layer between the sensor electrode PE and the eleventh sensor circuit SC11.

What is claimed is:

1. A display device comprising:

a first-first pixel circuit, a first-second pixel circuit, a first-third pixel circuit, and a first sensor circuit arranged sequentially in a first circuit row;

a second-first pixel circuit, a second-second pixel circuit, a second-third pixel circuit, and a second sensor circuit arranged sequentially in a second circuit row following the first circuit row, the second sensor circuit being in a same pixel column as the first sensor circuit;

a third-first pixel circuit, a third-second pixel circuit, a third-third pixel circuit, and a third sensor circuit arranged sequentially in a third circuit row following the second circuit row;

a first-first pixel electrode in a first pixel row corresponding to the first circuit row, and electrically connected to the first-first pixel circuit;

a first sensor electrode in the first pixel row, electrically connected to the first sensor circuit, and spaced from the first sensor circuit in plan view;

a second sensor electrode in the first pixel row, and electrically connected to the second sensor circuit;

a second-first pixel electrode in a second pixel row corresponding to the second circuit row, and electrically connected to the second-first pixel circuit; and a third sensor electrode in a third pixel row corresponding to the third circuit row, and electrically connected to the third sensor circuit.

2. The display device of claim 1, wherein the second sensor electrode is spaced apart from the first sensor electrode in a first direction, and wherein the third sensor electrode is spaced apart from the first sensor electrode in a second direction intersecting the first direction.

3. The display device of claim 2, wherein a gap between the first sensor electrode and the second sensor electrode is substantially equal to a gap between the first sensor electrode and the third sensor electrode.

4. The display device of claim 2, further comprising:

a fourth-first pixel circuit, a fourth-second pixel circuit, a fourth-third pixel circuit, and a fourth sensor circuit arranged in a fourth circuit row following the third circuit row; and a fourth sensor electrode in the third pixel row, and electrically connected to the fourth sensor circuit.

5. The display device of claim 4, wherein the fourth sensor electrode is spaced apart from the third sensor electrode in the first direction, and is spaced apart from the second sensor electrode in the second direction.

6. The display device of claim 4, wherein a gap between the third sensor electrode and the fourth sensor electrode is substantially equal to a gap between the second sensor electrode and the fourth sensor electrode.

7. The display device of claim 1, further comprising a sensor connection electrode electrically connecting the first sensor circuit to the first sensor electrode.

8. The display device of claim 7, wherein the first-third pixel circuit is between the first-first pixel electrode and the first sensor circuit, and wherein the sensor connection electrode overlaps the first-third pixel circuit.

9. The display device of claim 7, wherein the sensor connection electrode is integral with the first sensor electrode in a same layer.

10. The display device of claim 7, wherein the sensor connection electrode is in a layer between the first sensor circuit and the first sensor electrode.

11. The display device of claim 1, wherein a width of each of the first-first pixel circuit, the first-second pixel circuit, and the first-third pixel circuit in a first direction is greater than a width of the first sensor circuit in the first direction.

12. The display device of claim 1, wherein the first-first pixel circuit comprises:

a first transistor for controlling a driving current supplied to the first-first pixel electrode;

a second transistor for supplying a data voltage to a first electrode of the first transistor;

a third transistor for electrically connecting a second electrode of the first transistor to a gate electrode of the first transistor; and a fourth transistor for supplying an initialization voltage to the gate electrode of the first transistor, wherein the first and second transistors comprise a silicon-based semiconductor region, and wherein the third and fourth transistors comprise an oxide-based semiconductor region.

13. The display device of claim 1, wherein the first sensor circuit comprises:

a first sensor transistor comprising a gate electrode electrically connected to the first sensor electrode;

a second sensor transistor supplying an initialization voltage to the gate electrode of the first sensor transistor; and a third sensor transistor electrically connecting the first sensor transistor to a read-out line, wherein the first and third sensor transistors comprise a silicon-based semiconductor region, and wherein the second sensor transistor comprises an oxide-based semiconductor region.

14. A display device comprising:

a first-first pixel circuit, a first-second pixel circuit, a first-third pixel circuit, a first-fourth pixel circuit, and a first sensor circuit arranged sequentially in a first circuit row;

a second-first pixel circuit, a second-second pixel circuit, a second-third pixel circuit, a second-fourth pixel circuit, and a second sensor circuit arranged sequentially in a second circuit row following the first circuit row, the second sensor circuit being in a same pixel column as the first sensor circuit;

a first-first pixel electrode in a first pixel row corresponding to the first circuit row, and electrically connected to the first-first pixel circuit;

a first-second pixel electrode in the first pixel row, and electrically connected to the first-second pixel circuit;

a first-third pixel electrode in the first pixel row, and electrically connected to the first-third pixel circuit;

a first sensor electrode in the first pixel row, electrically connected to the first sensor circuit, and spaced from the first sensor circuit in plan view; and a second sensor electrode in the first pixel row and electrically connected to the second sensor circuit.

15. The display device of claim 14, wherein the first sensor electrode is at least partially surrounded by the first-first pixel electrode, the first-second pixel electrode, and the first-third pixel electrode.

16. The display device of claim 14, further comprising:

a second-first pixel electrode in a second pixel row corresponding to the second circuit row, and electrically connected to the second-first pixel circuit;

a second-second pixel electrode in the second pixel row, and electrically connected to the second-second pixel circuit; and a second-third pixel electrode in the second pixel row, and electrically connected to the second-third pixel circuit.

17. The display device of claim 14, wherein the first sensor electrode and the second sensor electrode overlap the first circuit row, and do not overlap the second circuit row.

18. The display device of claim 14, further comprising:

a third-first pixel circuit, a third-second pixel circuit, a third-third pixel circuit, a third-fourth pixel circuit, and a third sensor circuit arranged sequentially in a third circuit row following the second circuit row;

a fourth-first pixel circuit, a fourth-second pixel circuit, a fourth-third pixel circuit, a fourth-fourth pixel circuit, and a fourth sensor circuit arranged sequentially in a fourth circuit row following the third circuit row;

a third sensor electrode in a third pixel row corresponding to the third circuit row, and electrically connected to the third sensor circuit; and a fourth sensor electrode in the third pixel row, and electrically connected to the fourth sensor circuit.

19. The display device of claim 18, wherein the third sensor electrode and the fourth sensor electrode overlap the third circuit row, and do not overlap the fourth circuit row.

20. The display device of claim 18, wherein a gap between the first sensor electrode and the second sensor electrode is substantially equal to a gap between the first sensor electrode and the third sensor electrode.

* * * * *